United States Patent
Chung et al.

(10) Patent No.: US 12,074,064 B2
(45) Date of Patent: Aug. 27, 2024

(54) TSV STRUCTURE AND METHOD FORMING SAME

(71) Applicant: Taiwan Semiconductor Manufacturing Co., Ltd., Hsinchu (TW)

(72) Inventors: Ming-Tsu Chung, Hsinchu (TW); Ku-Feng Yang, Baoshan Township (TW); Tsang-Jiuh Wu, Hsinchu (TW); Wen-Chih Chiou, Zhunan Township (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 102 days.

(21) Appl. No.: 17/814,775

(22) Filed: Jul. 25, 2022

(65) Prior Publication Data

US 2022/0359292 A1    Nov. 10, 2022

Related U.S. Application Data

(62) Division of application No. 17/139,030, filed on Dec. 31, 2020, now Pat. No. 11,527,439.

(60) Provisional application No. 63/081,502, filed on Sep. 22, 2020.

(51) Int. Cl.
*H01L 21/768* (2006.01)
*H01L 23/48* (2006.01)
*H01L 23/532* (2006.01)

(52) U.S. Cl.
CPC .. *H01L 21/76898* (2013.01); *H01L 21/76831* (2013.01); *H01L 21/76832* (2013.01); *H01L 23/481* (2013.01); *H01L 23/53295* (2013.01)

(58) Field of Classification Search
CPC ........... H01L 21/76898; H01L 21/6835; H01L 21/76831; H01L 23/481; H01L 24/13
See application file for complete search history.

(56) References Cited

U.S. PATENT DOCUMENTS

| | | | |
|---|---|---|---|
| 6,539,625 B2 | 4/2003 | Engel et al. |
| 7,892,973 B2 | 2/2011 | Kawano et al. |
| 9,379,042 B2 | 6/2016 | Park et al. |
| 9,620,488 B2 | 4/2017 | Yu et al. |
| 9,627,295 B2 | 4/2017 | Jindal et al. |
| 11,600,551 B2 | 3/2023 | Chen |

(Continued)

FOREIGN PATENT DOCUMENTS

| | | | |
|---|---|---|---|
| JP | 2015079960 A | 4/2015 |
| KR | 20040012705 A | 2/2004 |

(Continued)

*Primary Examiner* — Jaehwan Oh
*Assistant Examiner* — John M Parker
(74) *Attorney, Agent, or Firm* — Slater Matsil, LLP

(57) ABSTRACT

A method includes forming a plurality of dielectric layers over a semiconductor substrate, etching the plurality of dielectric layers and the semiconductor substrate to form an opening, depositing a first liner extending into the opening, and depositing a second liner over the first liner. The second liner extends into the opening. The method further includes filling a conductive material into the opening to form a through-via, and forming conductive features on opposing sides of the semiconductor substrate. The conductive features are electrically interconnected through the through-via.

20 Claims, 31 Drawing Sheets

(56) References Cited

U.S. PATENT DOCUMENTS

| | | |
|---|---|---|
| 2004/0222529 A1* | 11/2004 | Dostalik ........... H01L 21/76831 |
| | | 257/E23.145 |
| 2009/0124072 A1 | 5/2009 | Park et al. |
| 2009/0191708 A1 | 7/2009 | Kropewnicki et al. |
| 2009/0278237 A1 | 11/2009 | Cooney, III et al. |
| 2009/0315154 A1 | 12/2009 | Kirby et al. |
| 2013/0161796 A1* | 6/2013 | Huang .............. H01L 21/76898 |
| | | 257/E21.585 |
| 2013/0299950 A1 | 11/2013 | Hummler |
| 2013/0320538 A1 | 12/2013 | Jindal et al. |
| 2013/0334669 A1 | 12/2013 | Kuo et al. |
| 2014/0162449 A1 | 6/2014 | An et al. |
| 2015/0115445 A1 | 4/2015 | Jindal et al. |

FOREIGN PATENT DOCUMENTS

| | | |
|---|---|---|
| KR | 20100083718 A | 7/2010 |
| KR | 20160075702 A | 6/2016 |
| KR | 20170022827 A | 3/2017 |
| TW | 201005907 A | 2/2010 |
| TW | 201342525 A | 10/2013 |

* cited by examiner

US 12,074,064 B2

TSV STRUCTURE AND METHOD FORMING SAME

PRIORITY CLAIM AND CROSS-REFERENCE

This application is a divisional of U.S. patent application Ser. No. 17/139,030, filed Dec. 31, 2020 and entitled "TSV Structure and Method Forming Same," which claims the benefit of the U.S. Provisional Application No. 63/081,502, filed Sep. 22, 2020, and entitled "Novel TSV Structure," which applications are hereby incorporated herein by reference.

BACKGROUND

Through-Silicon Vias (TSVs) are used as electrical paths in device dies, so that the conductive features on opposite sides of the device dies may be interconnected. The formation process of a TSV includes etching a semiconductor substrate to form an opening, filling the opening with a conductive material to form the TSV, performing a backside grinding process to remove a portion of the semiconductor substrate from backside, and forming an electrical connector on the backside of the semiconductor substrate to connect to the TSV.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
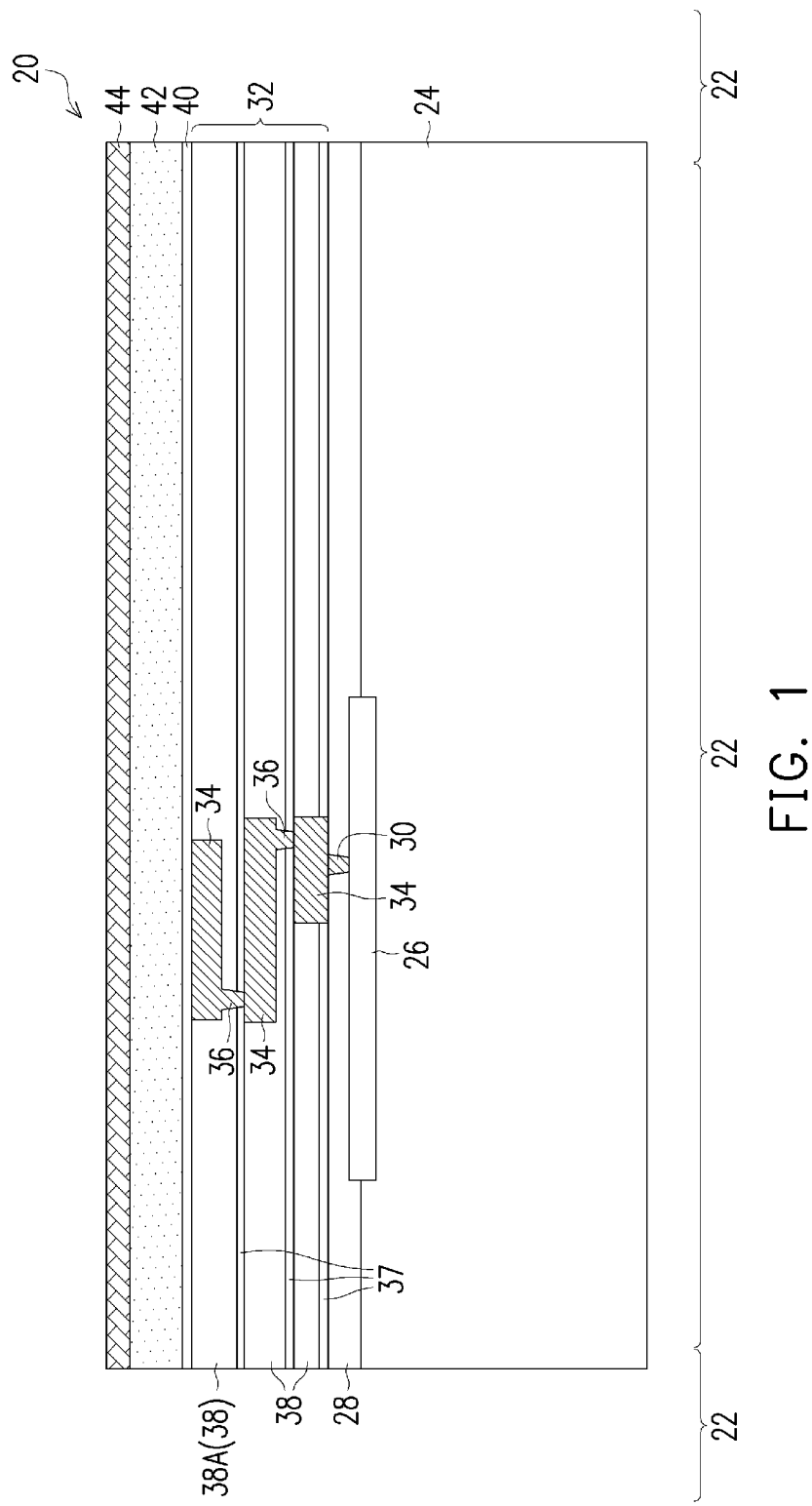
FIGS. 1, 2, 3A, 3B, 3C, 3D, 3E, 3F, 3G, 4-13, 14A, 14B, 14C, 14D, 14E, 14F, and 14G illustrate the cross-sectional views of intermediate stages in the formation of dies including through-vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A die including multi-layer liners for through-vias and the method of forming the same are provided in accordance with some embodiments. The die includes a plurality of liners, which are formed of different materials, and may have different heights. For example, an outer liner may be formed of a dense material to act as a diffusion barrier, and may be thin to reduce parasitic capacitance. An inner liner may be thicker, and may have a lower k-value than the outer liner. With the multi-layer design, the liners of through-vias may have improved ability for preventing diffusion, while the parasitic capacitance between the through-vias and other features such as the semiconductor substrate is not adversely increased. The intermediate stages in the formation of the die are illustrated in accordance with some embodiments. Some variations of some embodiments are discussed. Throughout the various views and illustrative embodiments, like reference numbers are used to designate like elements.

Figure 20:
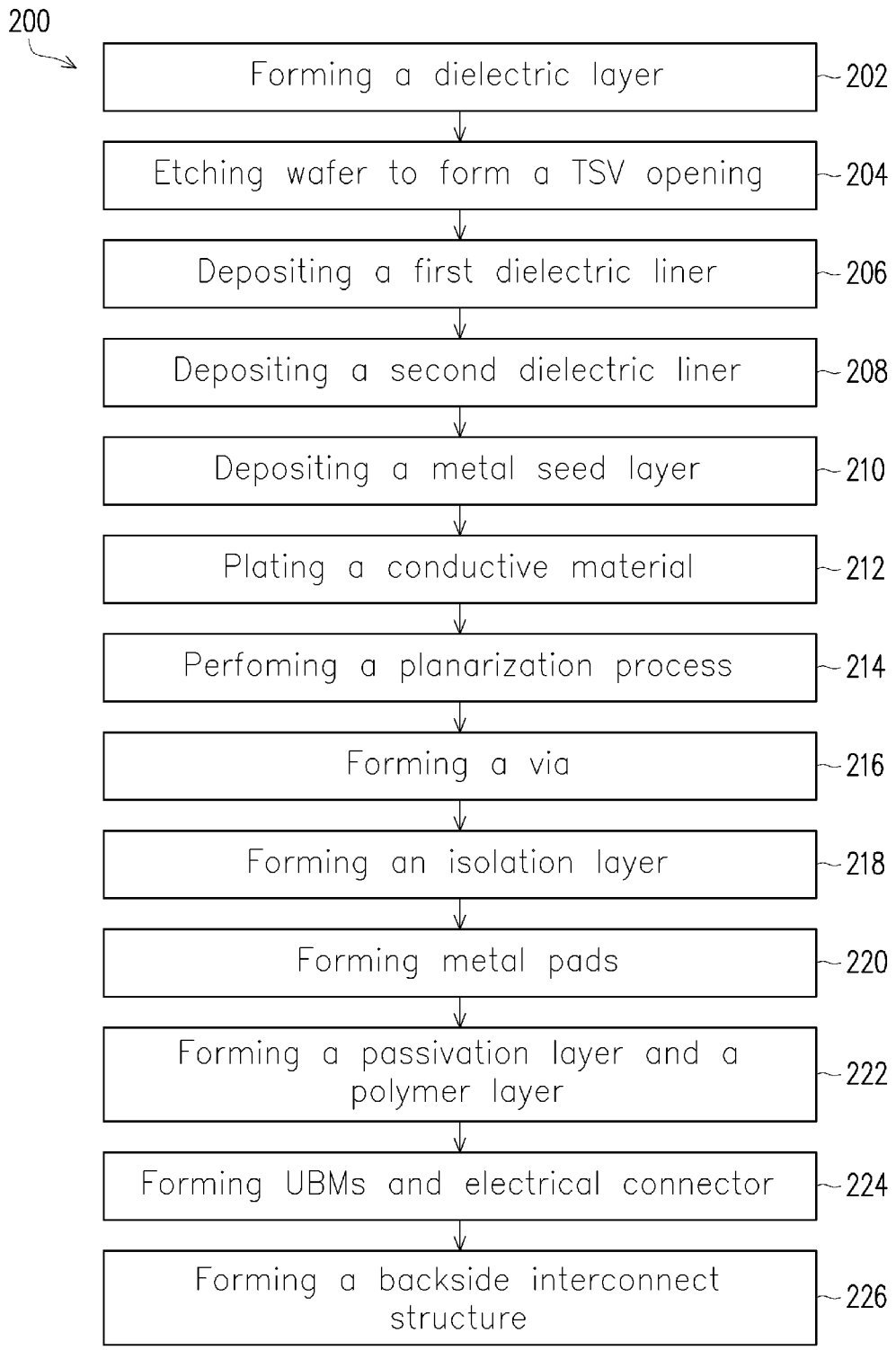
FIG. 20 illustrates a process flow for forming a die including a multi-liner through-via in accordance with some embodiments.

FIGS. 1, 2, 3A, 3B, 3C, 3D, 3E, 3F, 3G, 4-13, 14A, 14B, 14C, 14D, 14E, 14F, and 14G illustrate the cross-sectional views of intermediate stages in the formation of a die including through-vias in accordance with some embodiments of the present disclosure. The corresponding processes are also reflected schematically in the process flow 200 as shown in FIG. 20.

FIG. 1 illustrates a cross-sectional view of wafer 20. In accordance with some embodiments of the present disclosure, wafer 20 is or comprises a device wafer including active devices and possibly passive devices, which are represented as integrated circuit devices 26. Wafer 20 may include a plurality of chips/dies 22 therein, with one of chips 22 being illustrated. In accordance with alternative embodiments of the present disclosure, wafer 20 is an interposer wafer, which is free from active devices, and may or may not include passive devices.

In accordance with some embodiments of the present disclosure, wafer 20 includes semiconductor substrate 24 and the features formed at a top surface of semiconductor substrate 24. Semiconductor substrate 24 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. Shallow Trench Isolation (STI) regions (not shown) may be formed in semiconductor substrate 24 to isolate the active regions in semiconductor substrate 24.

In accordance with some embodiments of the present disclosure, wafer 20 includes integrated circuit devices 26, which are formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, wafer 20 is used for forming interposers (which are free from active devices), and substrate 24 may be a semiconductor substrate or a dielectric substrate.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of silicon oxide, Phospho Silicate Glass (PSG), Boro Silicate Glass (BSG), Boron-doped Phospho Silicate Glass (BPSG), Fluorine-doped Silicate Glass (FSG), or the like. ILD 28 may be formed using spin coating, Flowable Chemical Vapor Deposition (FCVD), or the like. In accordance with some embodiments of the present disclosure, ILD 28 may also be formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys thereof, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Over ILD 28 and contact plugs 30 resides interconnect structure 32. Interconnect structure 32 includes metal lines 34 and vias 36, which are formed in dielectric layers 38 (also referred to as Inter-metal Dielectrics (IMDs)) and etch stop layers 37. The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material in the dielectric layers 38, and then performing a curing process to drive out the porogen, and hence the remaining dielectric layers 38 are porous. Etch stop layers 37 may be formed of or comprises silicon nitride, silicon carbide, silicon oxycarbide, silicon oxynitride, or the like.

The formation of metal lines 34 and vias 36 in dielectric layers 38 may include single damascene processes and/or dual damascene processes. In a single damascene process for forming a metal line or a via, a trench or a via opening is first formed in one of dielectric layers 38, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Metal lines 34 include top conductive (metal) features such as metal lines, metal pads, or vias (denoted as 34A) in a top dielectric layer (denoted as dielectric layer 38A), which is the top layer of dielectric layers 38. In accordance with some embodiments, dielectric layer 38A is formed of a low-k dielectric material similar to the material of lower ones of dielectric layers 38. The metal lines 34 in top dielectric layer 38A may also be formed of copper or a copper alloy, and may have a dual damascene structure or a single damascene structure.

In accordance with some embodiments, etch stop layer 40 is deposited on the top dielectric layer 38A and the top metal layer. Etch stop layer 40 may be formed of or comprises silicon nitride, silicon carbide, silicon oxycarbide, silicon oxynitride, or the like.

Passivation layer 42 (sometimes referred to as passivation-1 or pass-1) is formed over etch stop layer 40. In accordance with some embodiments, passivation layer 42 is formed of a non-low-k dielectric material having a dielectric constant equal to or greater than about the dielectric constant of silicon oxide. Passivation layer 42 may be formed of or comprise an inorganic dielectric material, which may include a material selected from, and is not limited to, Undoped Silicate Glass (USG), silicon nitride (SiN), silicon oxide ($SiO_2$), silicon oxy-nitride (SiON), silicon oxy-carbide (SiOC), silicon carbide (SiC), or the like, combinations thereof, and/or multi-layers thereof. In accordance with some embodiments, the top surfaces of top dielectric layer 38A and metal lines 34 are level with one another. Accordingly, passivation layer 42 may be a planar layer.

In accordance with some embodiments, dielectric layer 44 is deposited over passivation layer 42. The respective process is illustrated as process 202 in the process flow 200 as shown in FIG. 20. Dielectric layer 44 is formed of or comprises a material different from that of passivation layer 42, and may be formed of or comprise SiC, SiN, SiON, SiOC, or the like.

Figure 2:
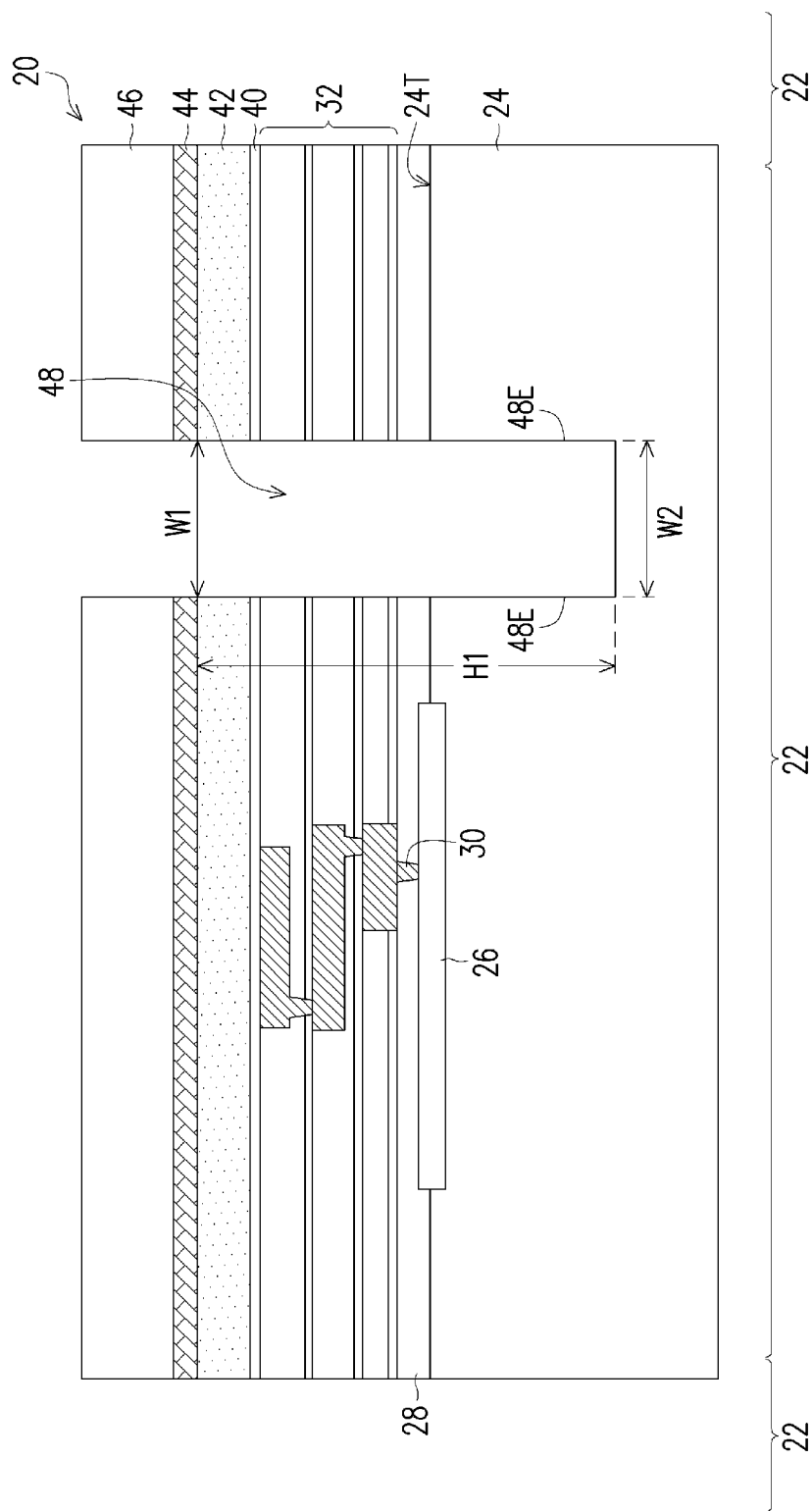

Referring to FIG. 2, etching mask 46 is formed and then patterned. In accordance with some embodiments, etching mask 46 comprises photo resist, and may or may not include a hard mask formed of TiN, BN, or the like. An anisotropic etching process is then performed to form an opening penetrating through dielectric layers including dielectric layer 44, passivation layer 42, etch stop layer 40, IMDs 38, etch stop layers 37, ILD 28, etc. Semiconductor substrate 24 is further etched so that opening 48 extends to an intermediate level of substrate 24, wherein the intermediate level is between the top surface 24T and the bottom surface of semiconductor substrate 24. Opening 48 is thus formed. The respective process is illustrated as process 204 in the process flow 200 as shown in FIG. 20. Opening 48 is used for forming a Through-Semiconductor Via (TSV, also sometimes referred to as a Through-Silicon Via), and hence is referred to as TSV opening 48 hereinafter. The anisotropic etching process includes a plurality of etching processes, which adopt different etching gases in order to etch the dielectric layers that are formed of different materials, and to etch semiconductor substrate 24.

In accordance with some embodiments, TSV opening 48 has top width W1 and bottom width W2 smaller than top width W1. TSV opening 48 may have slanted-and-straight edges 48E, wherein tilt angle α of the straight edges 48E are smaller than 90 degrees, for example, in the range between about 80 degrees and about 90 degrees. The aspect ratio H1/W1 of opening 48 may be in the range between about 2 and about 10 in accordance with some embodiments. Etching mask 46 is removed after the formation of TSV opening 48, for example, through an ashing process.

Figure 3A:
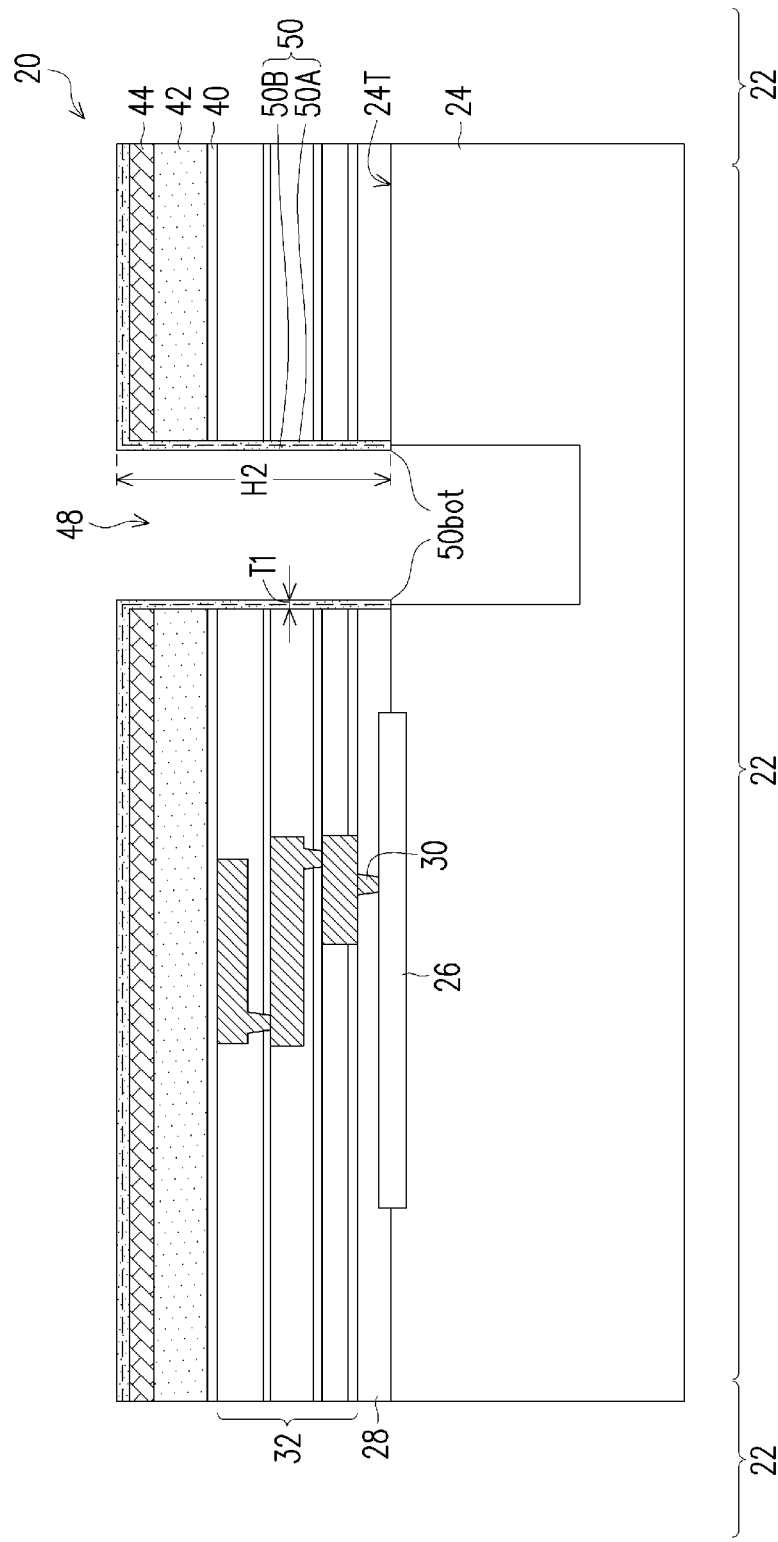

Referring to FIG. 3A, a first liner 50 is deposited. The respective process is illustrated as process 206 in the process flow 200 as shown in FIG. 20. Liner 50 includes horizontal portions outside of TSV opening 48, and vertical portions extending into TSV opening 48. In accordance with some embodiments, liner 50 is formed of or comprises a dielectric material such as silicon nitride, silicon carbide, silicon oxynitride, silicon oxycarbide, or the like, or combinations thereof. In accordance with alternative embodiments, liner 50 is formed of or comprises a conductive material such as Ti, TiN, Ta, TaN, or the like, or combinations thereof. The thickness T1 of liner 50 is small, so that liner 50, which may have a high k value, does not cause the adverse increase in parasitic capacitance of parasitic capacitors. For example, thickness T1 of liner 50 may be in the range between about 2 Å and about 500 Å, wherein the thickness T1 may be measured at a middle height of the vertical portions. The deposition method may include Plasma Enhance Chemical Vapor Deposition (PECVD), Final Atomic Layer Deposition (ALD), Physical Vapor Deposition (PVD), or the like. The precursors for forming liner 50 may include a silicon-containing precursor such as $SiCl_4$, $SiH_2Cl_2$, $Si_2Cl_6$, $Si_3Cl_8$, or the like, and a nitrogen-containing precursor such as $NH_3$, for example, when SiN is to be formed. In accordance with some embodiments, liner 50 has good ability for preventing diffusion, and may prevent undesirable substances from penetrating through it.

In accordance with some embodiments, the process conditions of the deposition of liner 50 are adjusted so that liner 50 is a non-conformal layer, and liner 50 covers the sidewalls of a top portion of TSV opening 48, while the sidewalls of the bottom portion of TSV opening 48 are not covered. In accordance with some embodiments, PECVD is used, and some process conditions are adjusted to achieve the desirable profile for liner 50. The adjusted process conditions may include the pressure of the process gas, a Si/N gas flow ratio, etc., wherein the Si/N gas flow ratio is the ratio of the flow rate of silicon-containing gas to the flow rate of the nitrogen-containing gas. For example, increasing the pressure of the process gas may cause liner 50 to extend less (so that height H2 is reduced) toward the bottom of TSV opening 48, while reducing the pressure may cause liner 50 to extend more toward the bottom of TSV opening 48. Increasing the Si/N gas flow ratio may cause liner 50 to extend less toward the bottom of TSV opening 48, while reducing the Si/N gas flow ratio may cause liner 50 to extend more toward the bottom of TSV opening 48. By selecting proper process conditions including the proper combination of the pressure and the Si/N gas flow ratio, the bottom of liner 50 may be located at a desirable height. For example, as shown in FIG. 3A, the bottom 50bot is at a level that is level with (or substantially level with) the top surface 24T of semiconductor substrate 24, for example, with a height difference smaller than about 100 nm.

Figure 3B:
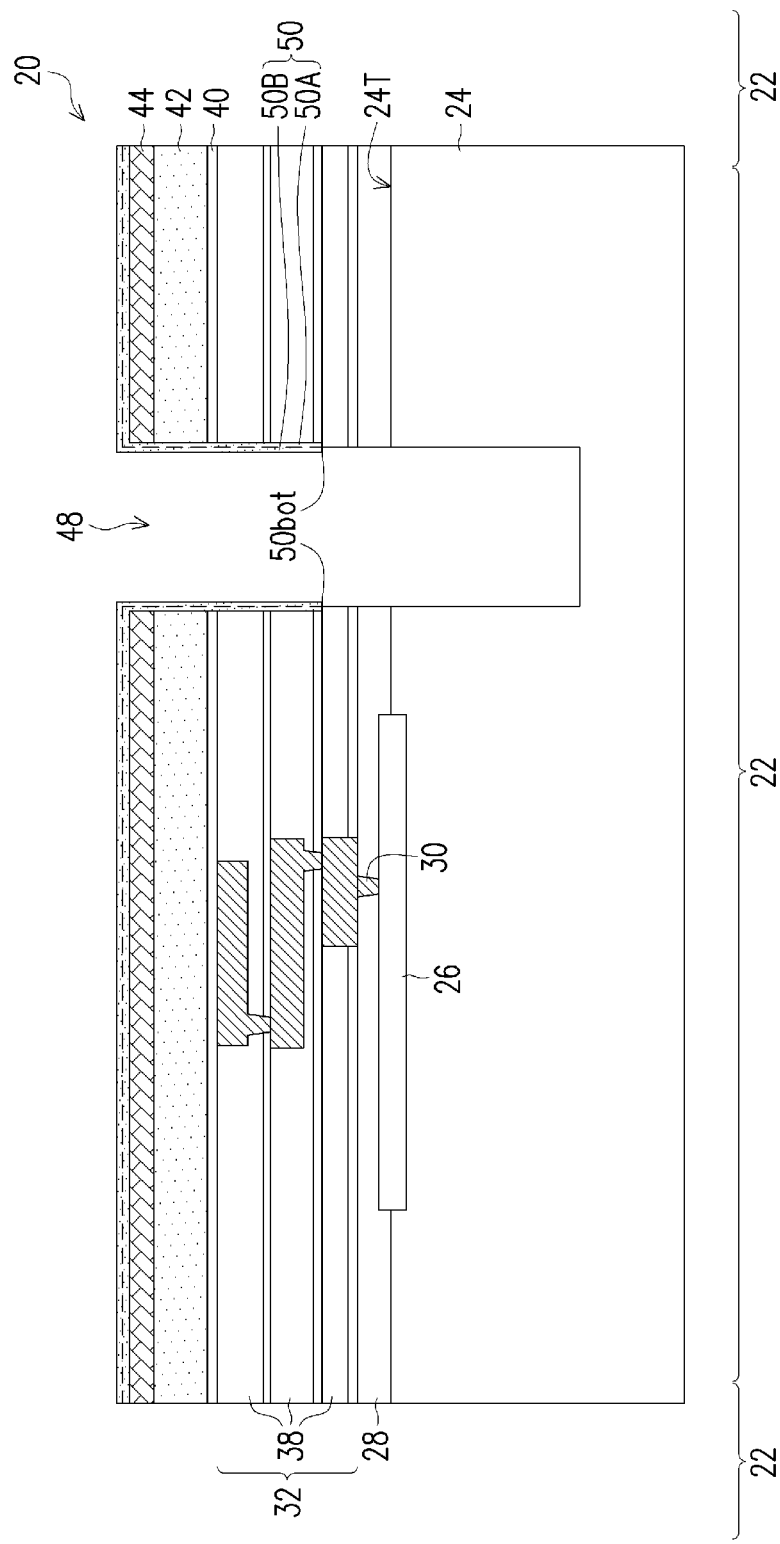

FIG. 3B illustrates the formation of liner 50 in accordance with alternative embodiments, in which the bottoms 50bot of liner 50 are higher than the top surface 24T of semiconductor substrate 24. For example, the sidewalls of the top layers of dielectric layers 38 may be covered by liner 50, while the sidewalls of some lower layers of dielectric layers 38 are not covered by liner 50. These embodiments may be applied when the bottom layers of dielectric layers 38 have higher k-values than the top layers of the dielectric layers 38, hence liner 50 is formed to cover the sidewalls of the dielectric layers 38 with lower k-values (for example, having k values lower than 3.8, or lower than about 3.5 or about 3.0), while the sidewalls of the dielectric layers 38 with higher k-values (for example, higher than about 3.5 or 3.8) are not protected. It is appreciated that parasitic capacitors may form between the resulting TSV and the surrounding conductive or semiconductor materials, and the parasitic capacitance between the TSV and semiconductor substrate 24 is a major contributor of the parasitic capacitance. Accordingly, with liner 50 (which has the higher k value than the subsequently formed liner 52 (FIG. 4)) not extending into semiconductor substrate 24 as shown in FIGS. 3A and 3B, the parasitic capacitance may be reduced.

Figure 3C:
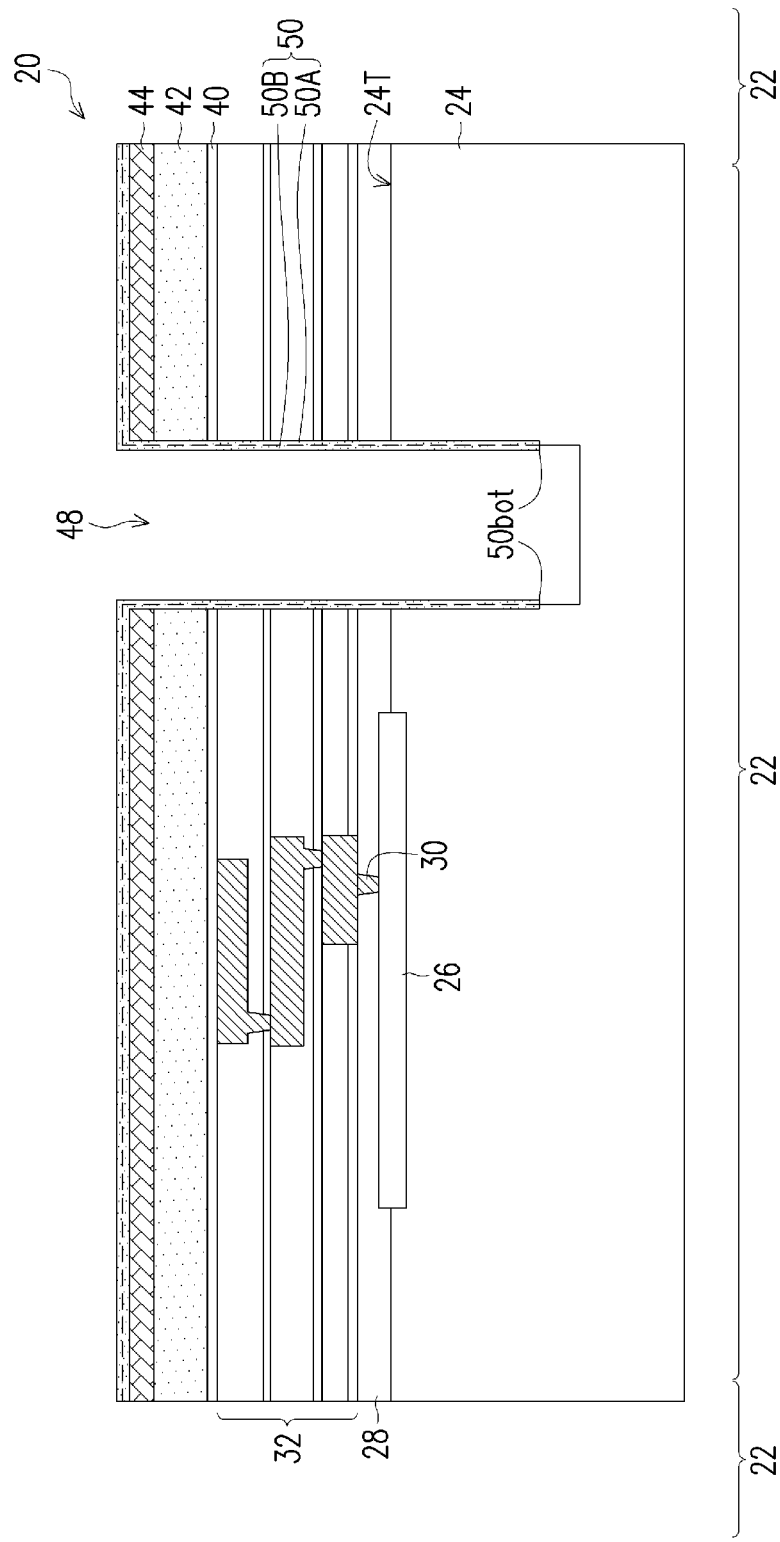

FIG. 3C illustrates the formation of liner 50 in accordance with yet alternative embodiments, wherein the bottoms 50bot of liner 50 are lower than the top surface 24T of semiconductor substrate 24, and higher than the bottom of TSV opening 48. The formation of the liner 50 in FIG. 3C may be achieved by selecting proper process conditions, as above discussed.

Figure 3D:
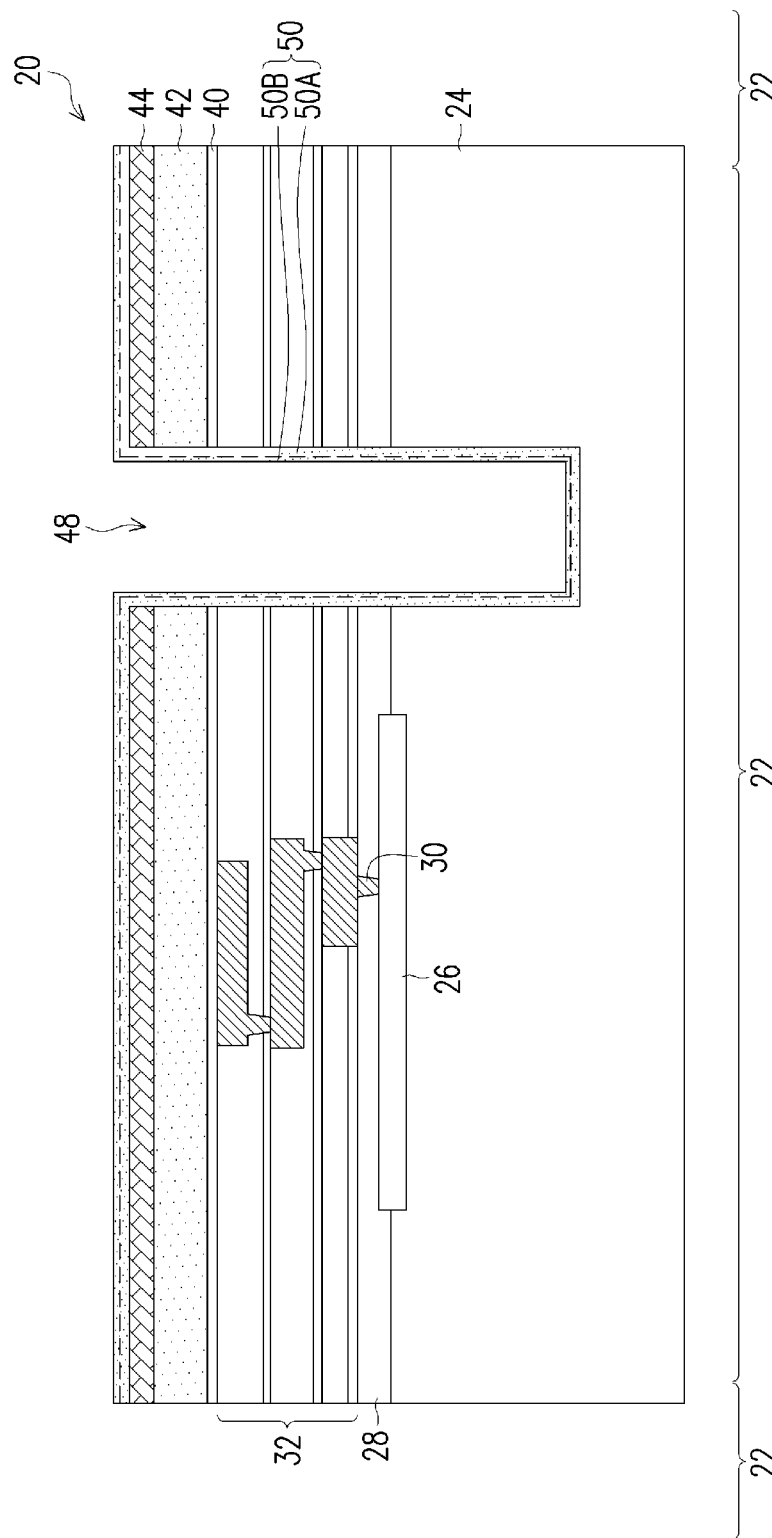

FIG. 3D illustrates the formation of liner 50 in accordance with yet alternative embodiments, wherein liner 50 covering all surfaces exposed to TSV opening 48, including the bottom surface of TSV opening 48. In accordance with some embodiments, the liner 50 in FIG. 3D may be formed using PECVD, and may be achieved by selecting proper process conditions, as above discussed. In accordance with alternative embodiments, liner 50 may be formed using a conformal deposition method such as ALD, CVD, or the like. The resulting liner 50 thus may be conformal, for example, with the horizontal portions and vertical portions having a thickness variation smaller than about 20 percent or about 10 percent.

The liners 50 as shown in FIGS. 3A, 3B, 3C, and 3D may be single-layer dielectric liners or composite liners such as dual-layer liners. FIGS. 3A, 3B, 3C, and 3D illustrate example dual-layer liners 50 including dielectric (sub) liners 50A and 50B. It is appreciated that the liners 50 in FIGS. 3A, 3B, 3C, and 3D may also be single-layer liners. Accordingly, the lines separating liners 50A and 50B are shown as dashed to indicate that these lines may or may not exist. In accordance of some embodiments, liners 50A and 50B are formed of different materials, or a same material having different compositions. For example, dielectric liner may both be formed of silicon nitride or silicon oxynitride, but the nitrogen atomic percentage of liner 50A may be higher than or lower than the nitrogen atomic percentage in liner 50B. Liners 50A and 50B may be formed in separate processes, which may (or may not) be formed in a same process chamber, and may (or may not) be formed in-situ with no vacuum break therebetween. Accordingly, although not shown in detail in FIGS. 3A, 3B, 3C, and 3D, liners 50A and 50B may extend to different depths, as shown in FIGS. 3E, 3F and 3G in accordance with some example embodiments.

Figure 3E:
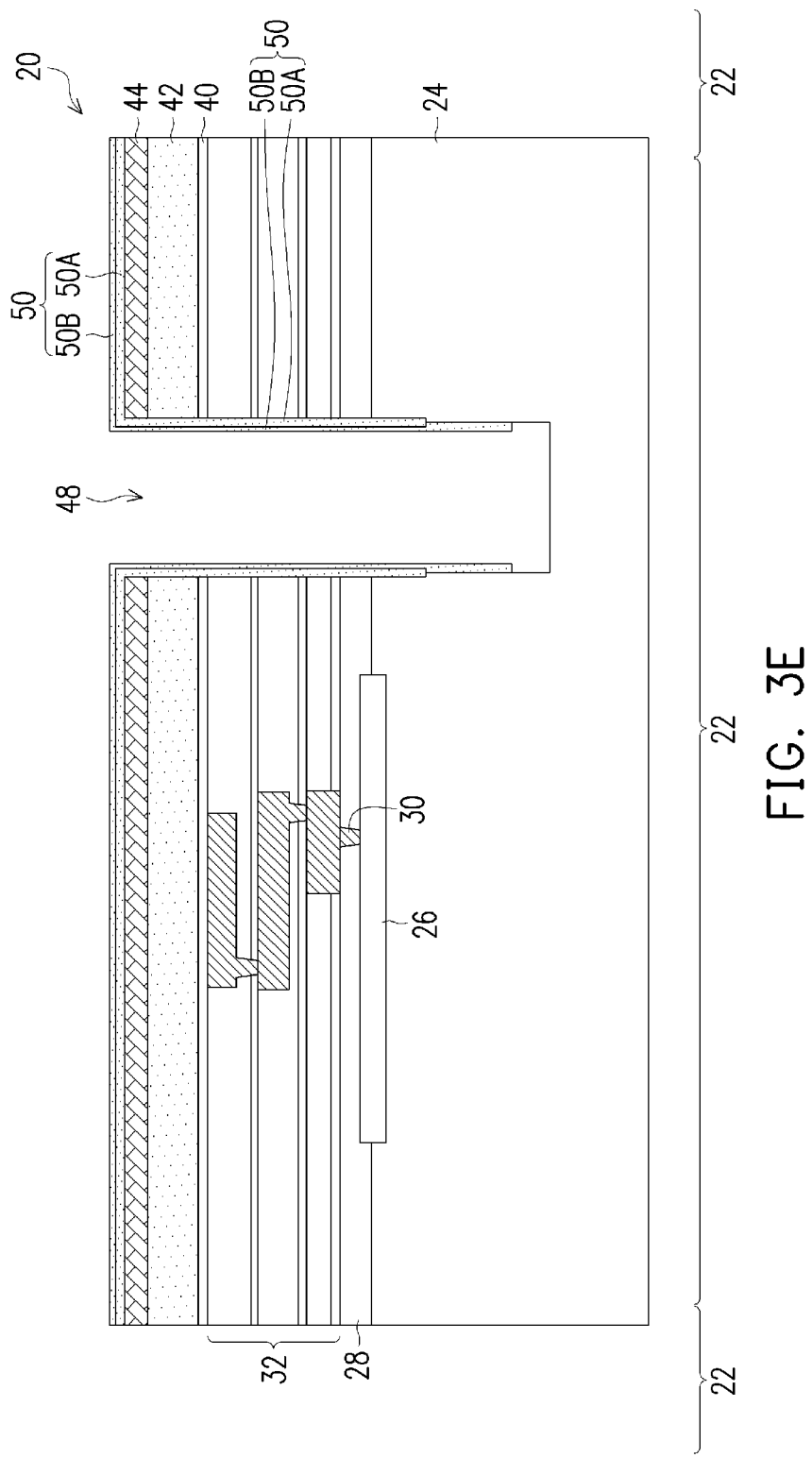
Figure 3F:
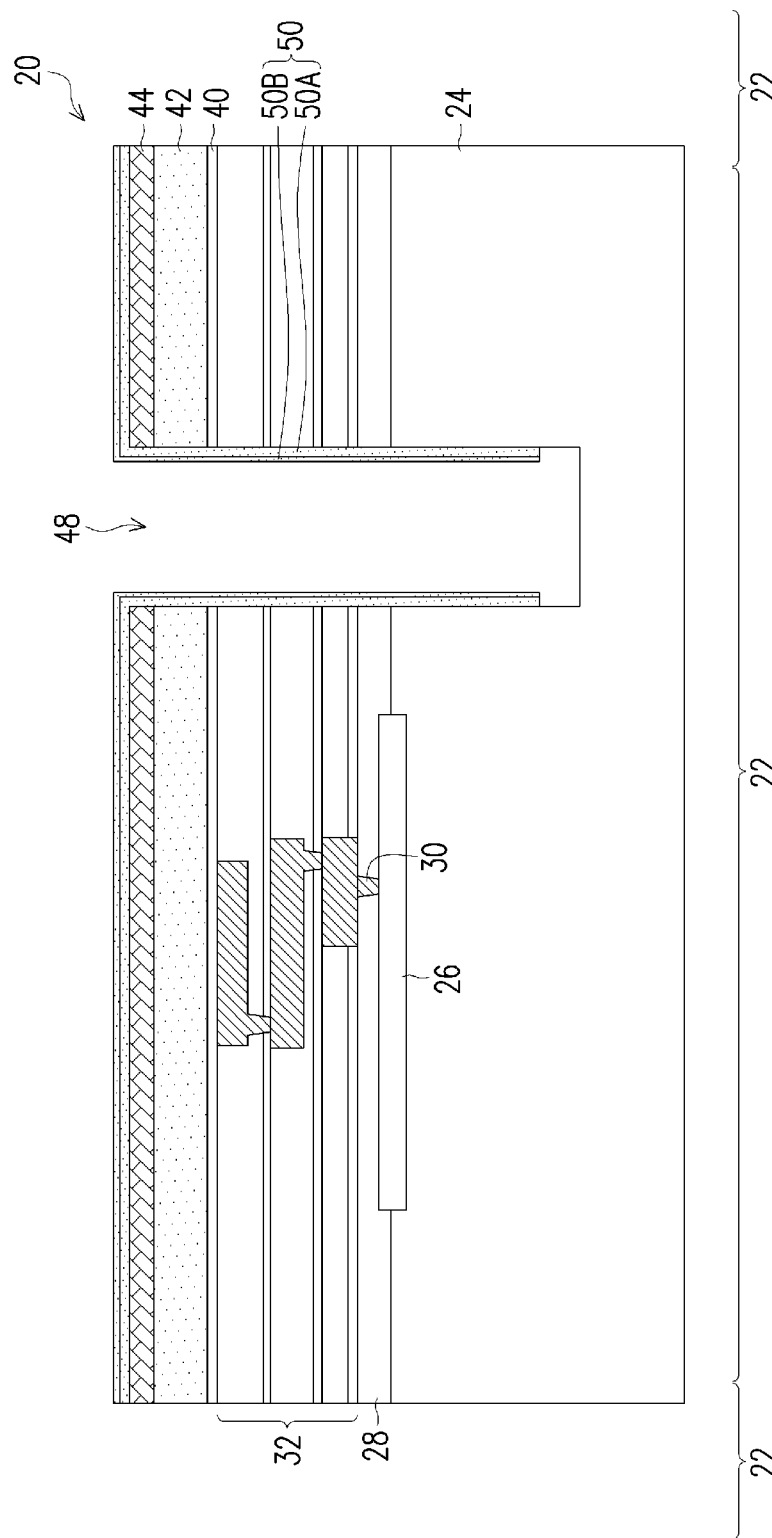
Figure 3G:
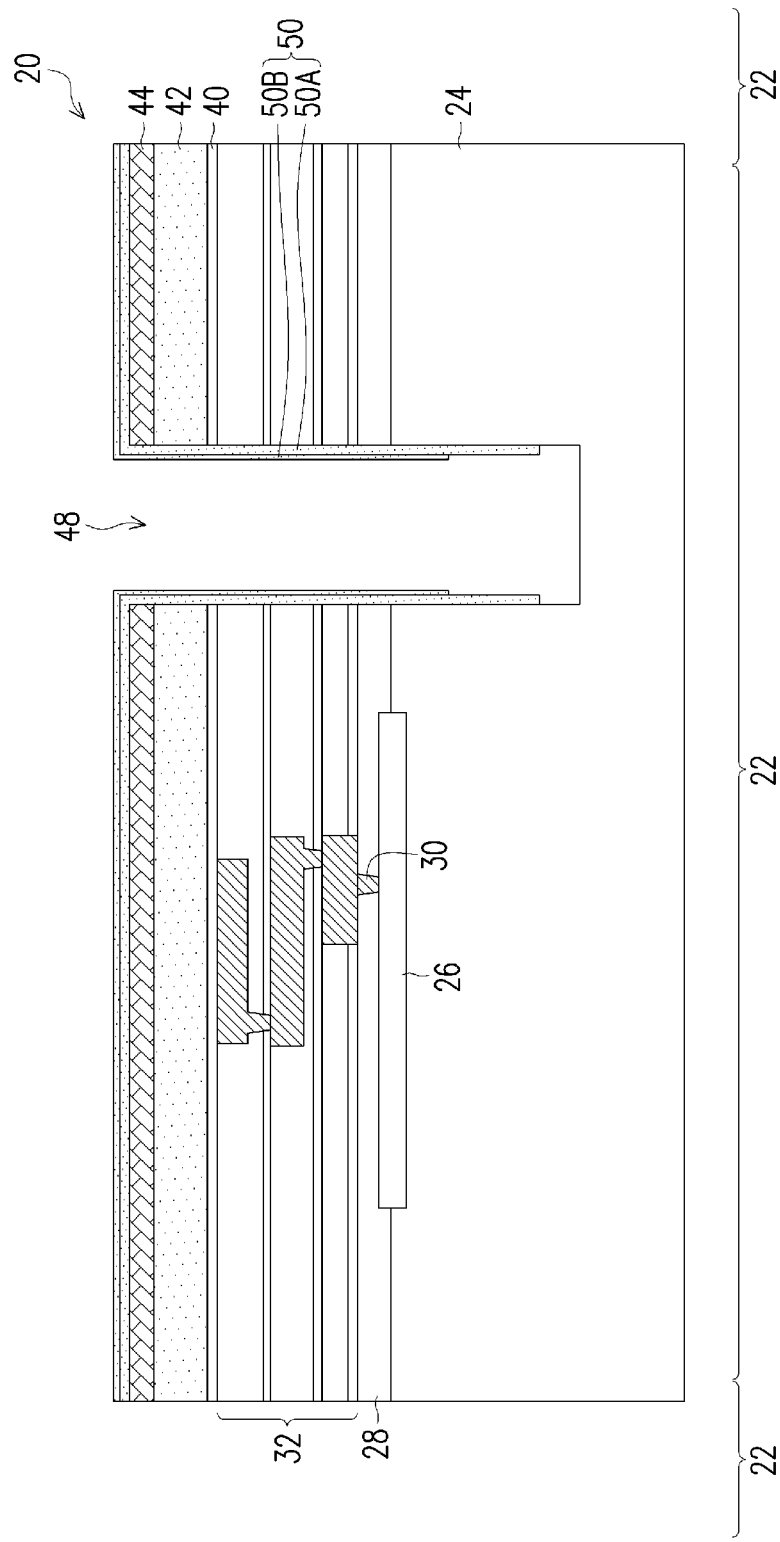

FIGS. 3E, 3F, and 3G illustrate some details of the dual-layer liners 50 as shown in FIGS. 3A, 3B, 3C, and 3D in accordance with some embodiments. It is appreciated that the illustrate bottom levels of liners 50A and 50B are examples, and the bottom of each of liners 50A and 50B may be at any level between the top and the bottom of TSV opening 48 in any combination. For example, the bottom of each of liners 50A and 50B may be at any level shown in FIGS. 3A, 3B, 3C and 3D. FIG. 3E illustrates an embodiment in which liner 50B extends deeper into TSV opening 48 than liner 50A. FIG. 3F illustrates an embodiment in which liner 50B extends to a same depth into TSV opening 48 as liner 50A. FIG. 3G illustrates an embodiment in which liner 50B extends less into TSV opening 48 than liner 50A.

Figure 16:
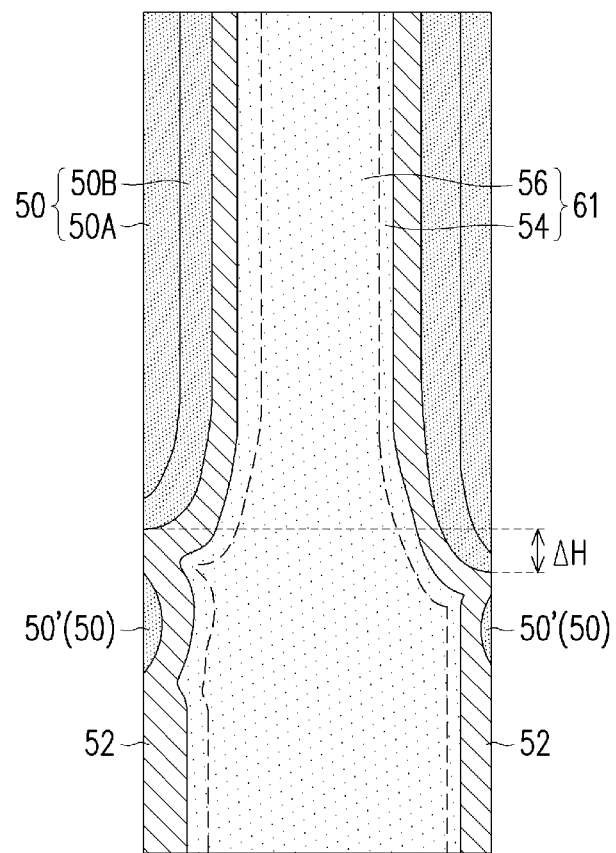
FIG. 16 illustrates a dielectric liner with gradually reduced bottom portion in accordance with some embodiments.

In the embodiments as shown in FIGS. 3A-3G, since the liners 50 (and the sub layers 50A and 50B) are deposited to different depths, the process variation may cause different portions of liners 50 to extend to the same or different depths. For example, in each of FIGS. 3A-3G, the portion of liners 50 on the left side of openings 48 may extend to the same depth, a greater depth, or a smaller depth, than the portion of liners 50 on the right side of openings 48. In addition, the bottom end portions of liners 50 may have gradually reduced thicknesses (rather than a uniform thickness). For example, FIG. 16 illustrates a bottom portion of liner 50 with the gradually reduced thickness. Furthermore, FIG. 16 illustrates that different portions of dielectric liner 50 may extend to different depths of TSV opening 48. The depth difference ΔH may be greater than about 100 nm in accordance with some embodiments.

Figure 4:
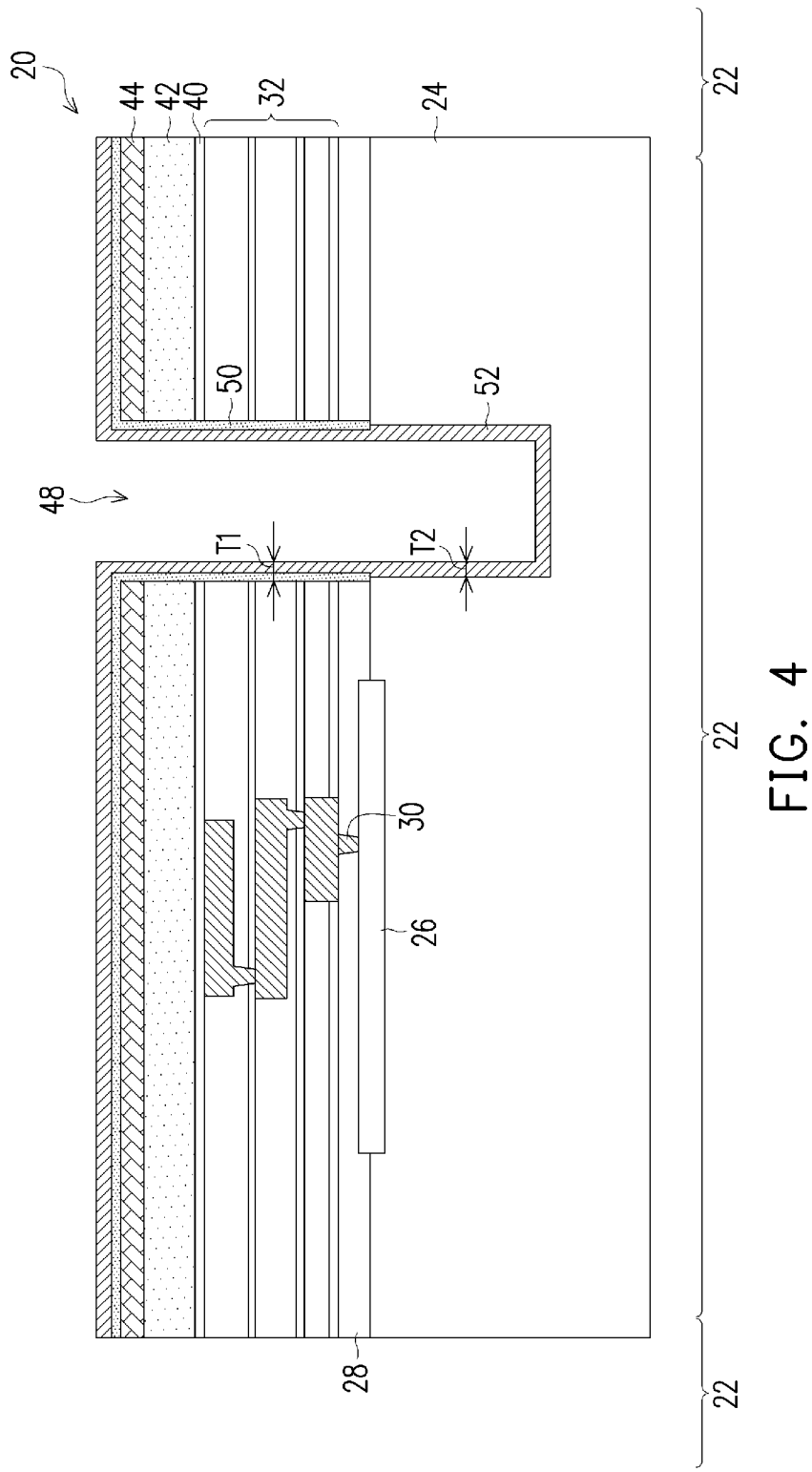

Referring to FIG. 4, a second liner 52 is deposited on the first liner 50. The respective process is illustrated as process 208 in the process flow 200 as shown in FIG. 20. In accordance with some embodiments, dielectric liner 52 is formed of a material different from the material(s) of liner 50. For example, dielectric liner 52 may be formed of or comprises a dielectric material such as silicon oxide, silicon oxynitride, or the like. Accordingly, liner 52 is alternatively referred to as dielectric liner 52. Dielectric liner 52 is deposited as a conformal layer, so that the horizontal portions and vertical portions of dielectric liner 52 have thicknesses close to each other, for example, with a variation smaller than about 20 percent or 10 percent. The deposition method may include Atomic Layer Deposition (ALD), Chemical Vapor Deposition (CVD), or the like. The thickness T2 of dielectric liner 52 may be in the range between about 500 Å and about 2,500 Å. Liners 50 and 52 are also collectively referred to as a multi-layer liner. A ratio T1:T2 may be in the range between about 0.001:1 and about 0.5:1 in accordance with some embodiments.

Liners 50 and 52 may have different densities. In accordance with some embodiments, dielectric liner 50 is denser than liner 52. For example, liner 50 may have a density DS50 in the range between about 3 g/cm$^3$ and about 10 g/cm$^3$. Dielectric liner 52 may have a density DS52 in the range between about 2.5 g/cm$^3$ and about 4 g/cm$^3$. The density difference (DS50−DS52) may be greater than about 0.5 g/cm$^3$, and may be in the range between about 0.5 g/cm$^3$ and about 7 g/cm$^3$.

Figure 5:
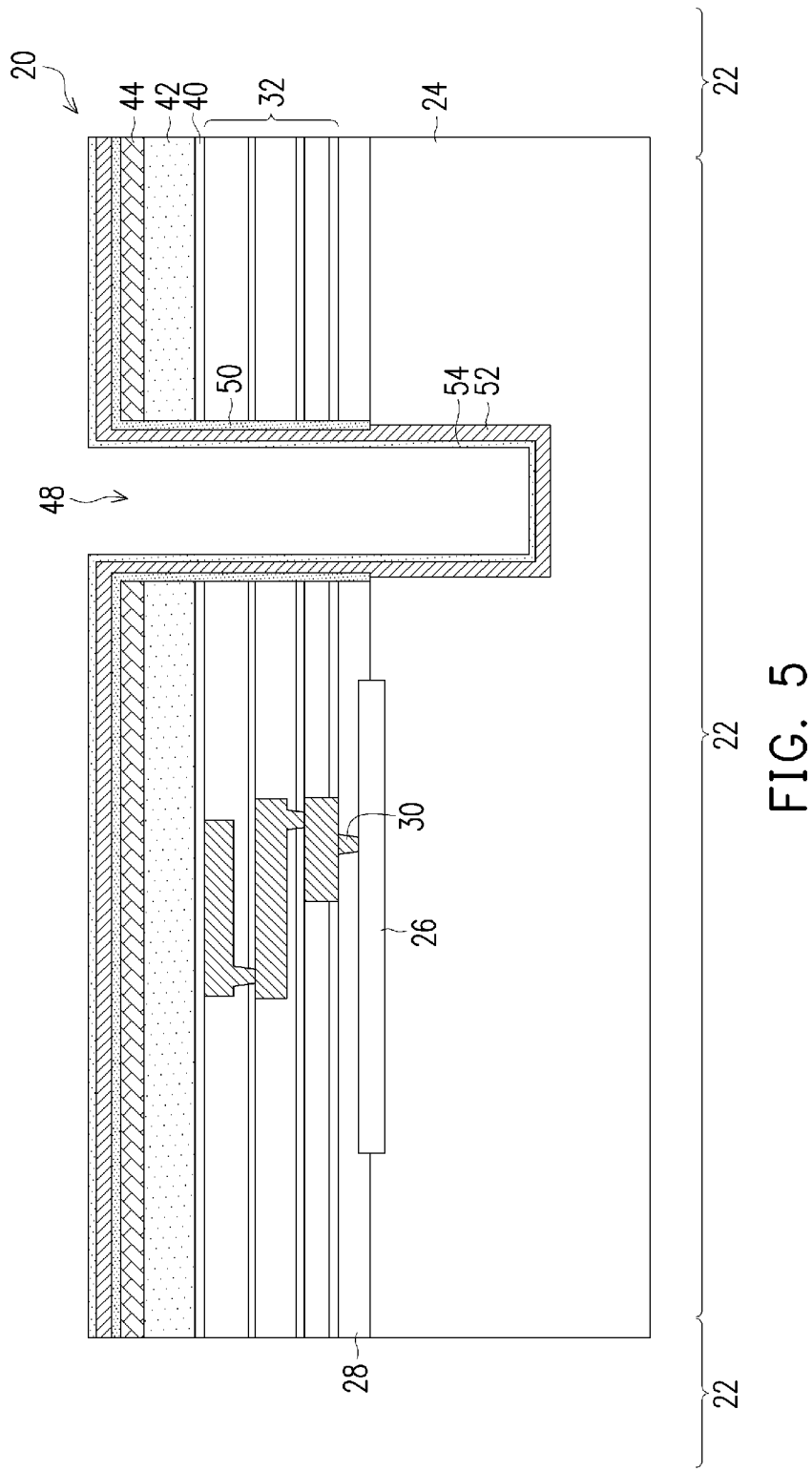

FIG. 5 illustrates the deposition of metal seed layer 54. The respective process is illustrated as process 210 in the process flow 200 as shown in FIG. 20. In accordance with some embodiments, metal seed layer 54 is formed through Physical Vapor Deposition (PVD). Metal seed layer 54 may be a single layer, for example, formed of copper, or may include a plurality of layers, for example, including a conductive barrier layer and a copper layer on the conductive barrier layer. The conductive barrier layer may be formed of or comprise TiN, Ti, TaN, Ta, or the like.

Figure 6:
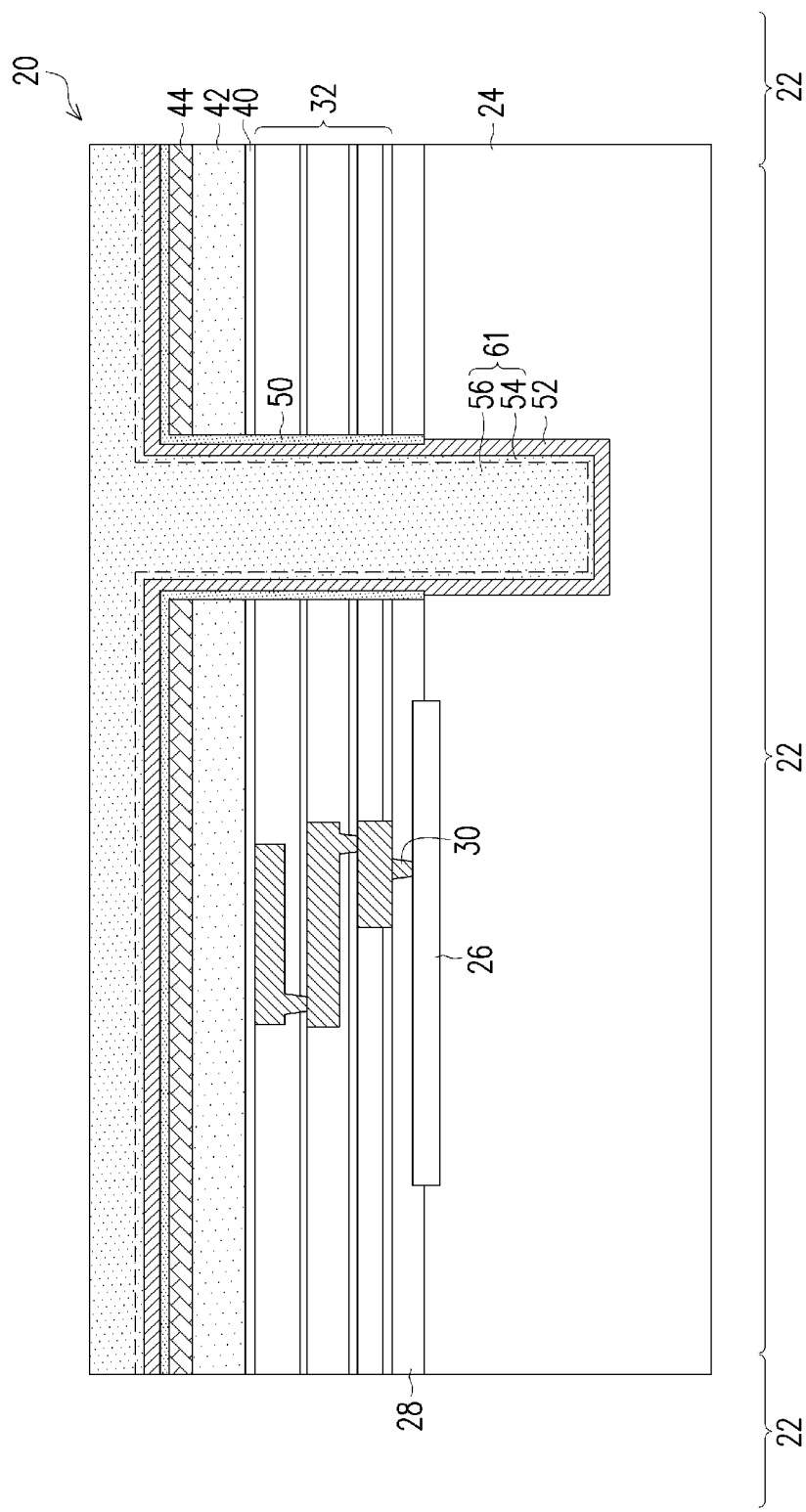

FIG. 6 illustrates the deposition of conductive material 56, which may be a metallic material such as copper or a copper alloy. The respective process is illustrated as process 212 in the process flow 200 as shown in FIG. 20. The deposition process may be performed using electrochemical plating (ECP), electro-less plating, or the like. The plating is performed until the top surface of the plated conductive material 56 is higher than the top surface of liner 50 or 52.

Figure 7:
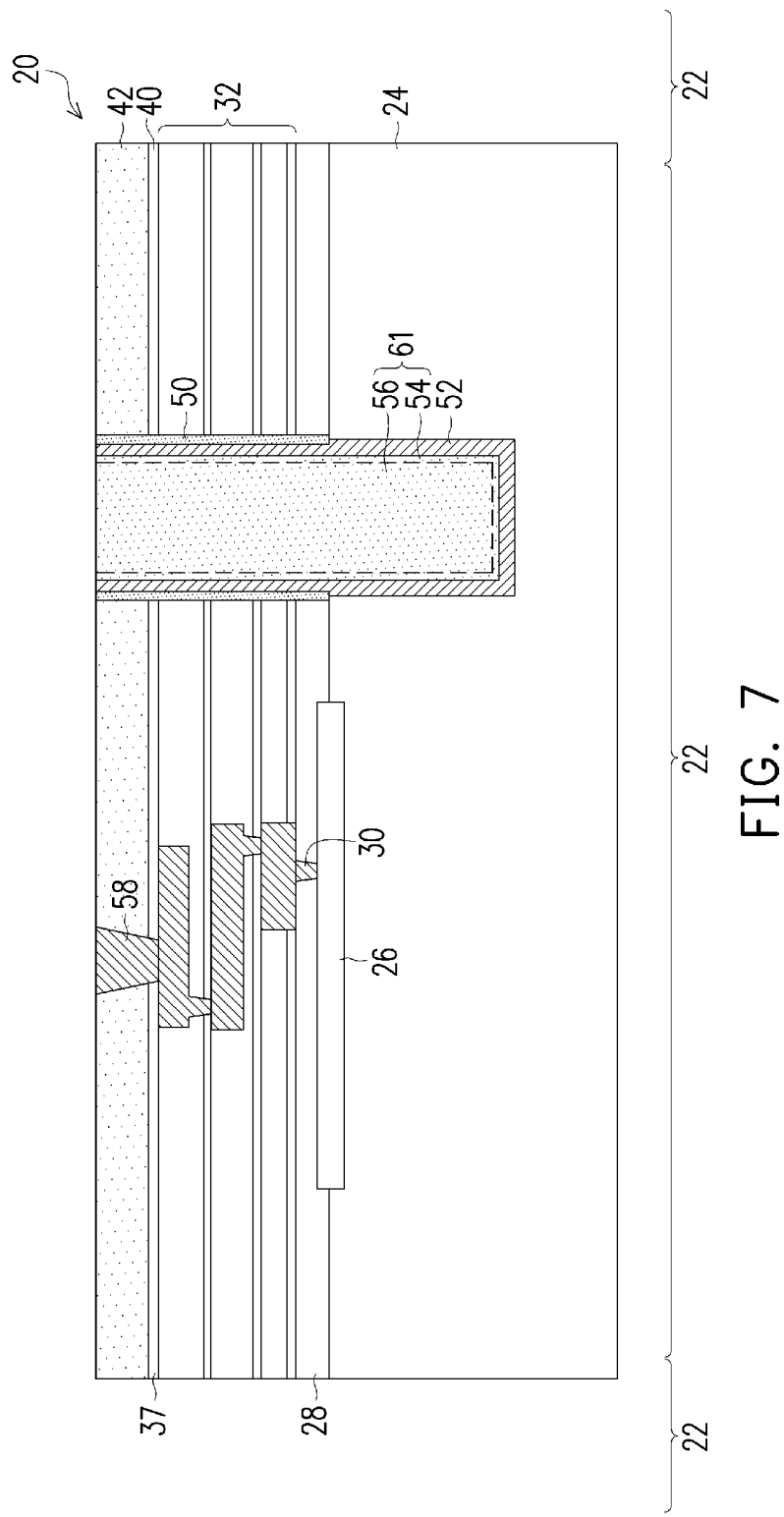

FIG. 7 illustrates a planarization process, which may be a CMP process or a mechanical grinding process, performed to planarize the top surface of conductive material 56. The respective process is illustrated as process 214 in the process flow 200 as shown in FIG. 20. In accordance with some embodiments, the planarization process is performed using dielectric layer 42 as a stop layer, as illustrated in FIG. 7. In accordance with alternative embodiments, the planarization process is performed using other dielectric layers such as dielectric layer 44 (FIG. 6) as a CMP stop layer. Accordingly, the top surface of the remaining conductive material 56 will be coplanar with the top surface of dielectric layer 44. The remaining portions of metal seed layer 54 and conductive material 56 are collectively referred to as through-via 61 hereinafter.

FIGS. 7 through 13 illustrate the formation of upper features in accordance with some embodiments. It is appreciated that these processes are examples, and any other connection scheme are contemplated by the present disclosure. Further referring to FIG. 7, via 58 is formed to connect to top metal line/pad 34. The respective process is illustrated as process 216 in the process flow 200 as shown in FIG. 20. In accordance with some embodiments, via 58 is formed through a single damascene process. The formation process may include etch passivation layer 42 and the underlying etch stop layer 37 to form an opening, depositing a conductive barrier (formed of titanium, titanium nitride, tantalum, tantalum nitride, or the like, for example), and plating a conductive material such as copper, tungsten, or the like. A CMP process may then be performed to remove excess material, leaving via 58.

Figure 8:
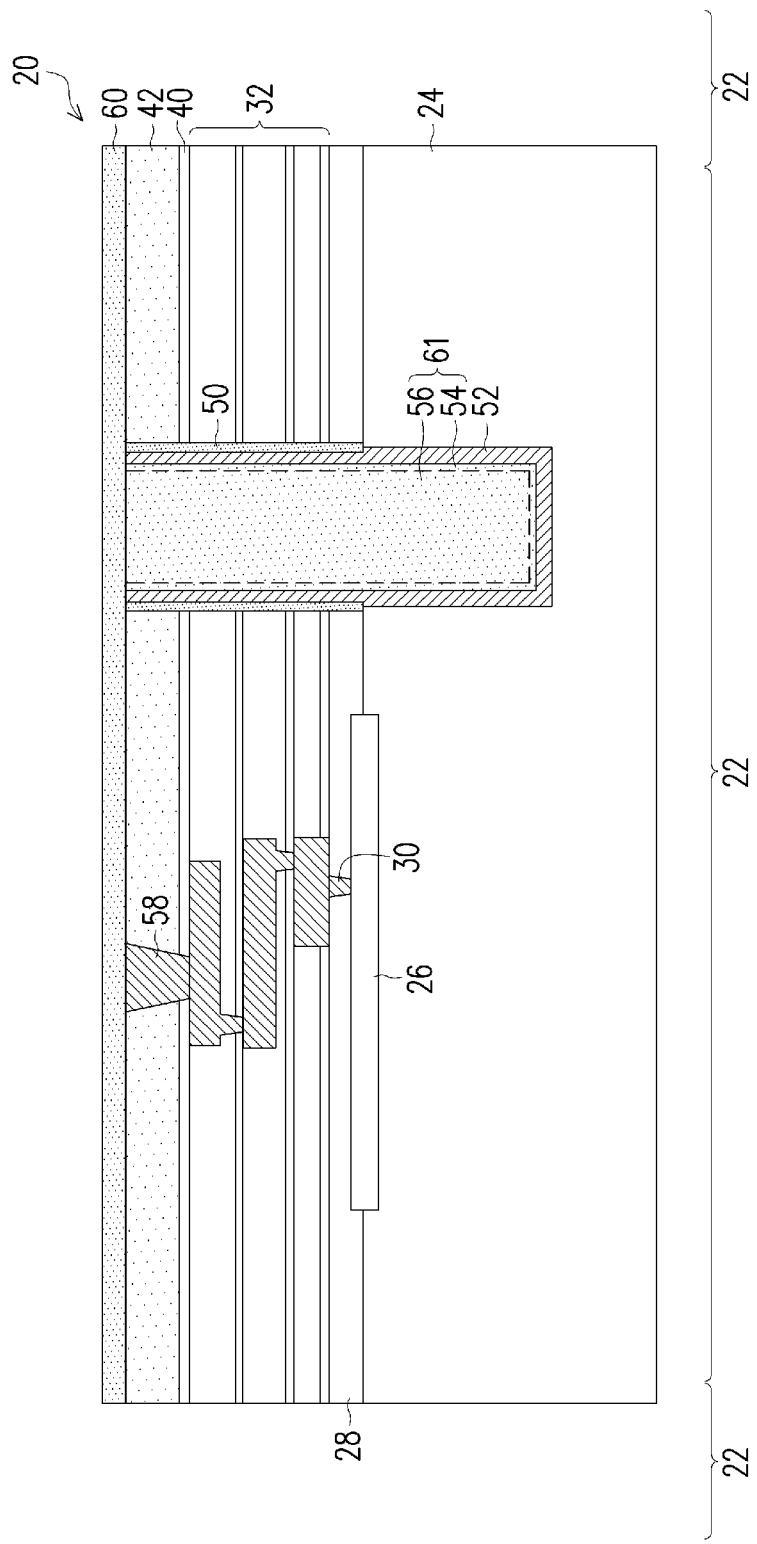

Referring to FIG. 8, in accordance with some embodiments, a dielectric isolation layer 60 is deposited. The respective process is illustrated as process 218 in the process flow 200 as shown in FIG. 20. The material of isolation layer 60 may be selected from the same group of candidate materials for forming liner 50, and may be the same as or different from the material of liner 50. For example, when liner 50 is formed of silicon nitride, isolation layer 60 may be formed of silicon nitride or silicon carbide.

Figure 9:
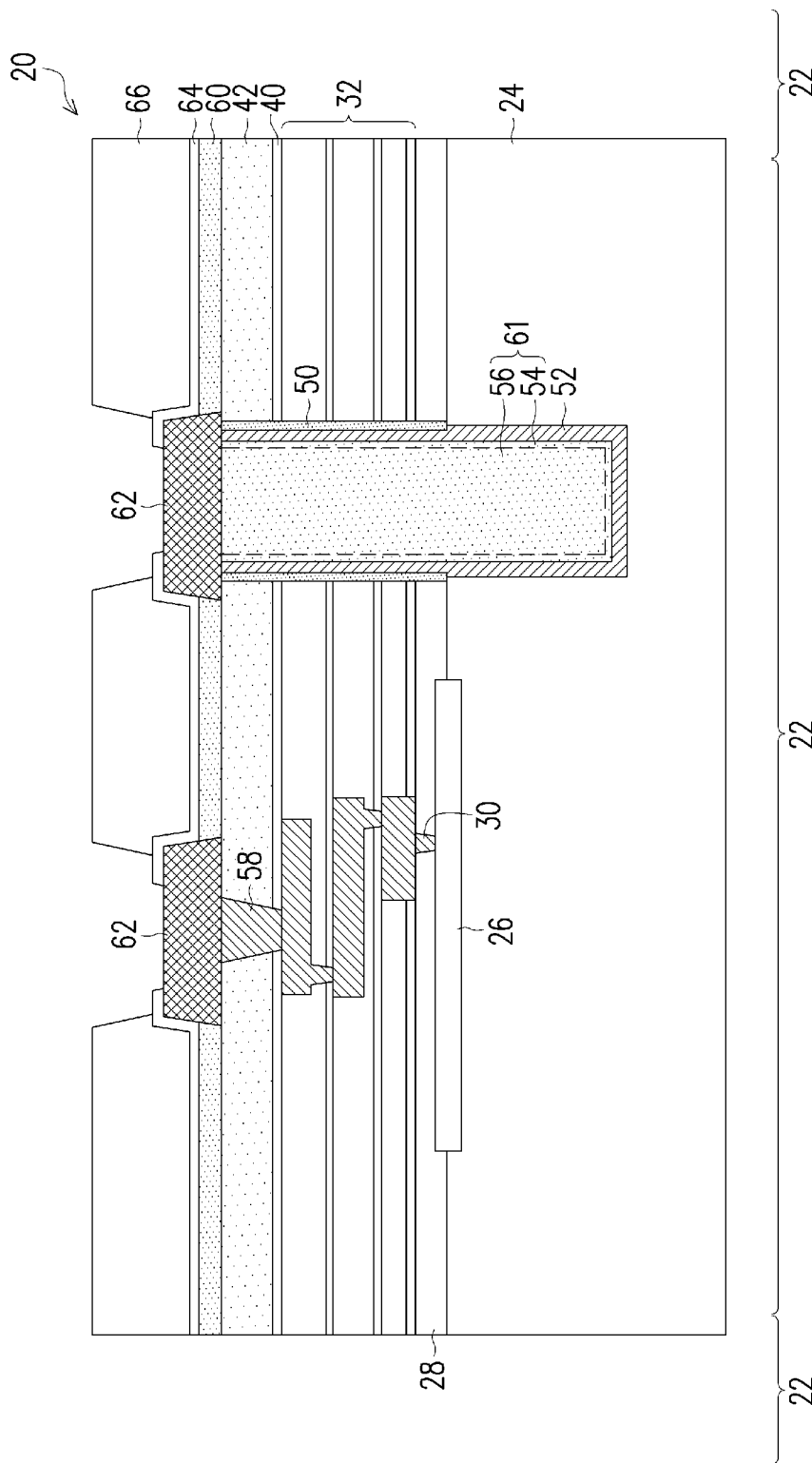

Referring to FIG. 9, isolation layer 60 is etched, and metal pads 62 are formed over passivation layer 42. The respective process is illustrated as process 220 in the process flow 200 as shown in FIG. 20. Metal pads 62 may be aluminum pads or aluminum-copper pads, and other metallic materials may be used. The formation process may include depositing a metal layer, and then patterning the metal layer to leave metal pads 62. Metal pads 62 may also have some portions extending directly over isolation layer 60 in accordance with some embodiments. Passivation layer 64 (sometimes referred to as passivation-2) is then formed. The respective process is illustrated as process 222 in the process flow 200 as shown in FIG. 20. Passivation layer 64 may be a single layer or a composite layer, and may be formed of a non-porous material such as silicon oxide, silicon nitride, USG, silicon oxynitride, or the like.

Next, passivation layer 64 is patterned, so that some portions of passivation layer 64 cover the edge portions of metal pads 62, and some portions of metal pads 62 are exposed through the openings in passivation layer 64. Polymer layer 66 is then formed, for example, by dispensing polymer layer 66 in a flowable form, and then curing polymer layer 66. Polymer layer 66 is patterned to expose metal pads 62. The respective process is also illustrated as process 222 in the process flow 200 as shown in FIG. 20. Polymer layer 66 may be formed of polyimide, polybenzoxazole (PBO), or the like.

Figure 10:
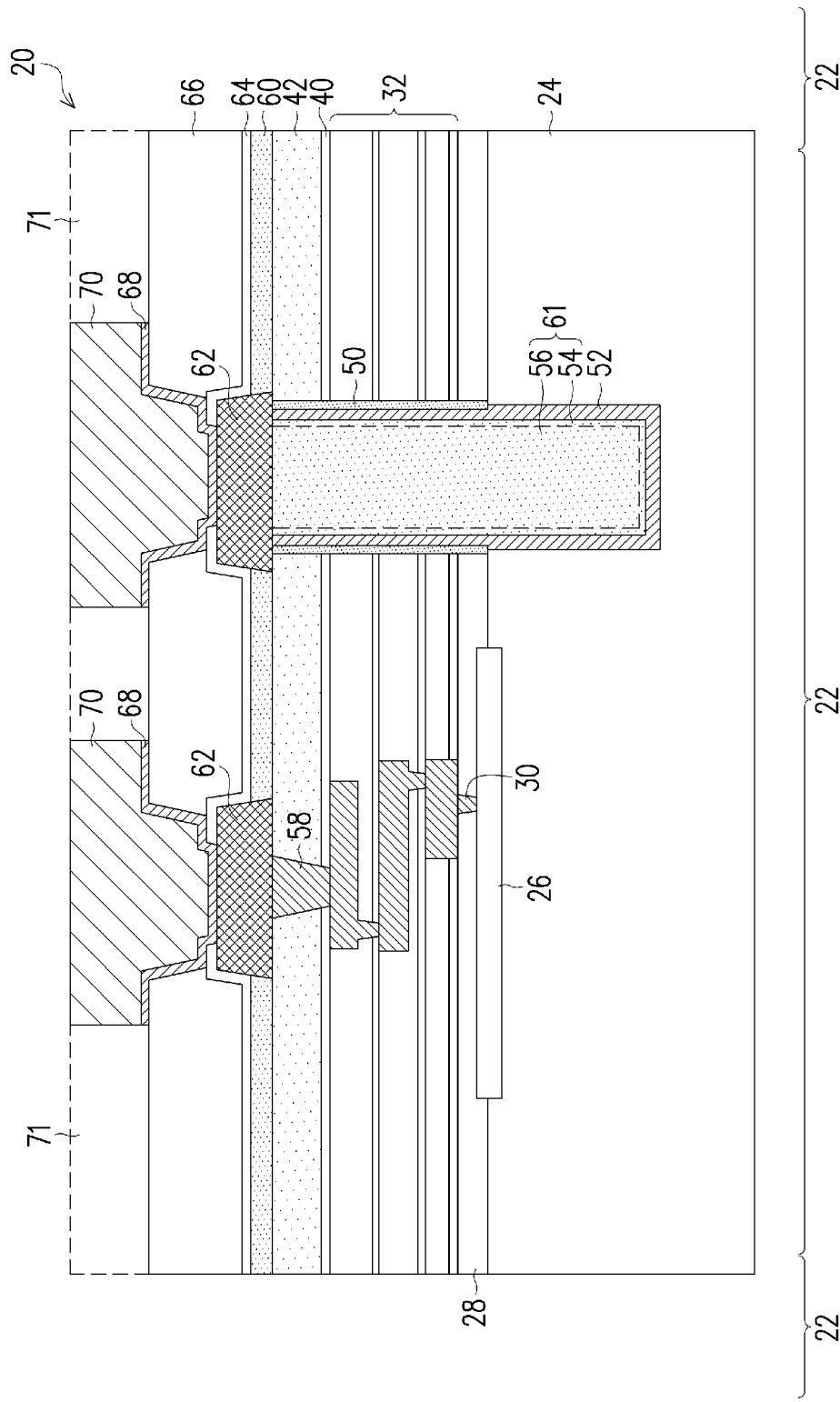

Under-Bump-Metallurgies (UBMs) 68 and conductive regions 70 are then formed to electrically connect to the underlying metal pads 62, as shown in FIG. 10. The respective process is illustrated as process 224 in the process flow 200 as shown in FIG. 20. The formation processes of UBMs 68 and conductive regions 70 may include depositing a blanket metal seed layer extending into the openings in passivation layer 64 and polymer layer 66, forming a patterned plating mask on the metal seed layer, plating conductive regions 70, removing the plating mask, and etching the portions of the blanket metal seed layer previously covered by the plating mask. The remaining portions of the blanket metal seed layer are referred to as UBMs 68. The metal seed layer may include a titanium layer and a copper layer over the titanium layer. Conductive regions 70 may comprise copper, nickel, palladium, aluminum, gold, alloys thereof, and/or multi-layers thereof. Each of conductive regions 70 may include a copper region, which may or may not be capped with a solder region, which may be formed of SnAg or like materials. In accordance with some embodiments, conductive regions 70 protrude higher than the top surface of the top dielectric layer in wafer 20, and may be used for solder bonding, direct metal-to-metal bonding, or the like. In accordance with alternative embodiments, dielectric layer 71 is formed to have a top surface coplanar with the top surfaces of conductive regions 70, and may be used for hybrid bonding.

Figure 11:
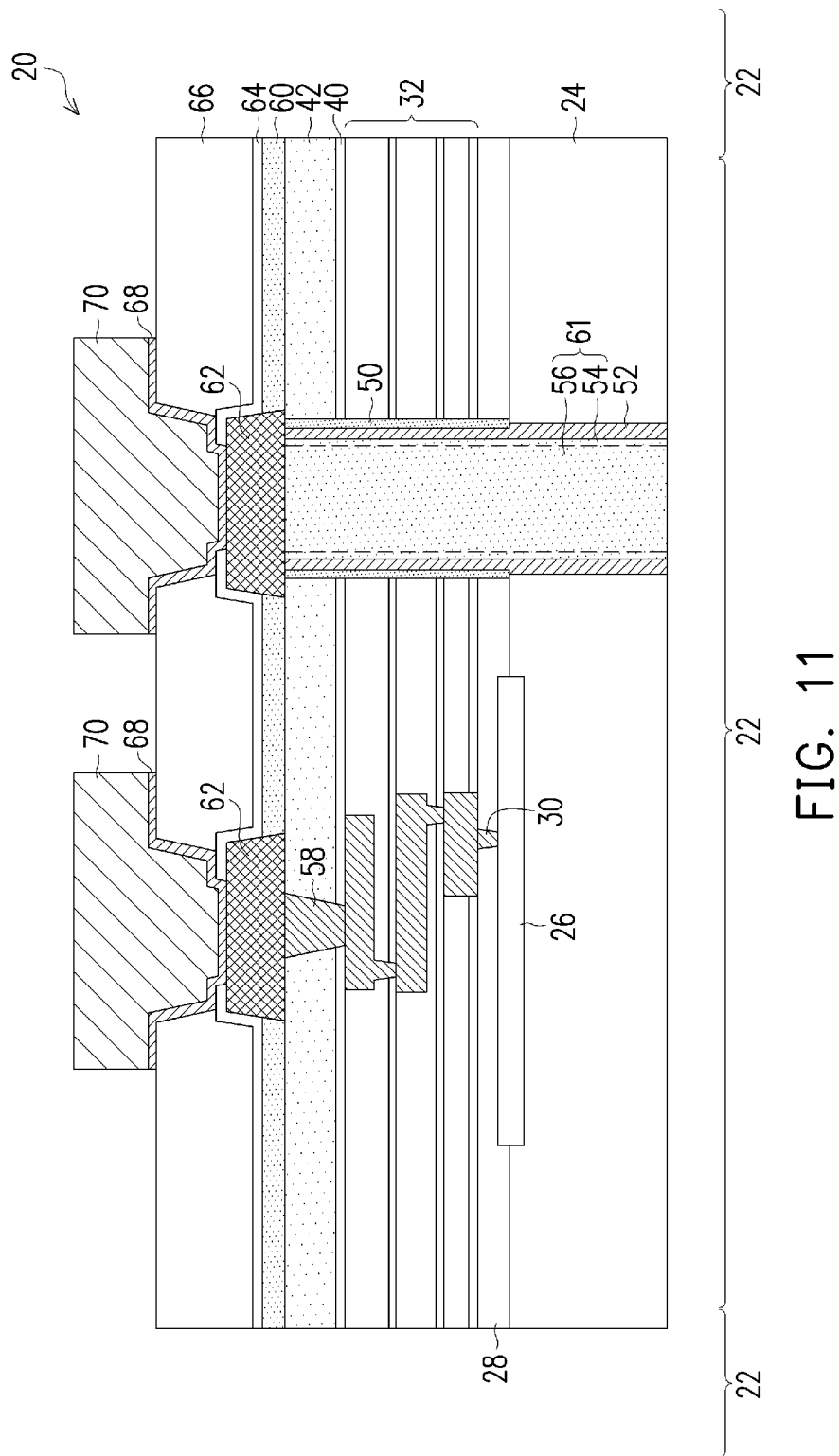
Figure 12:
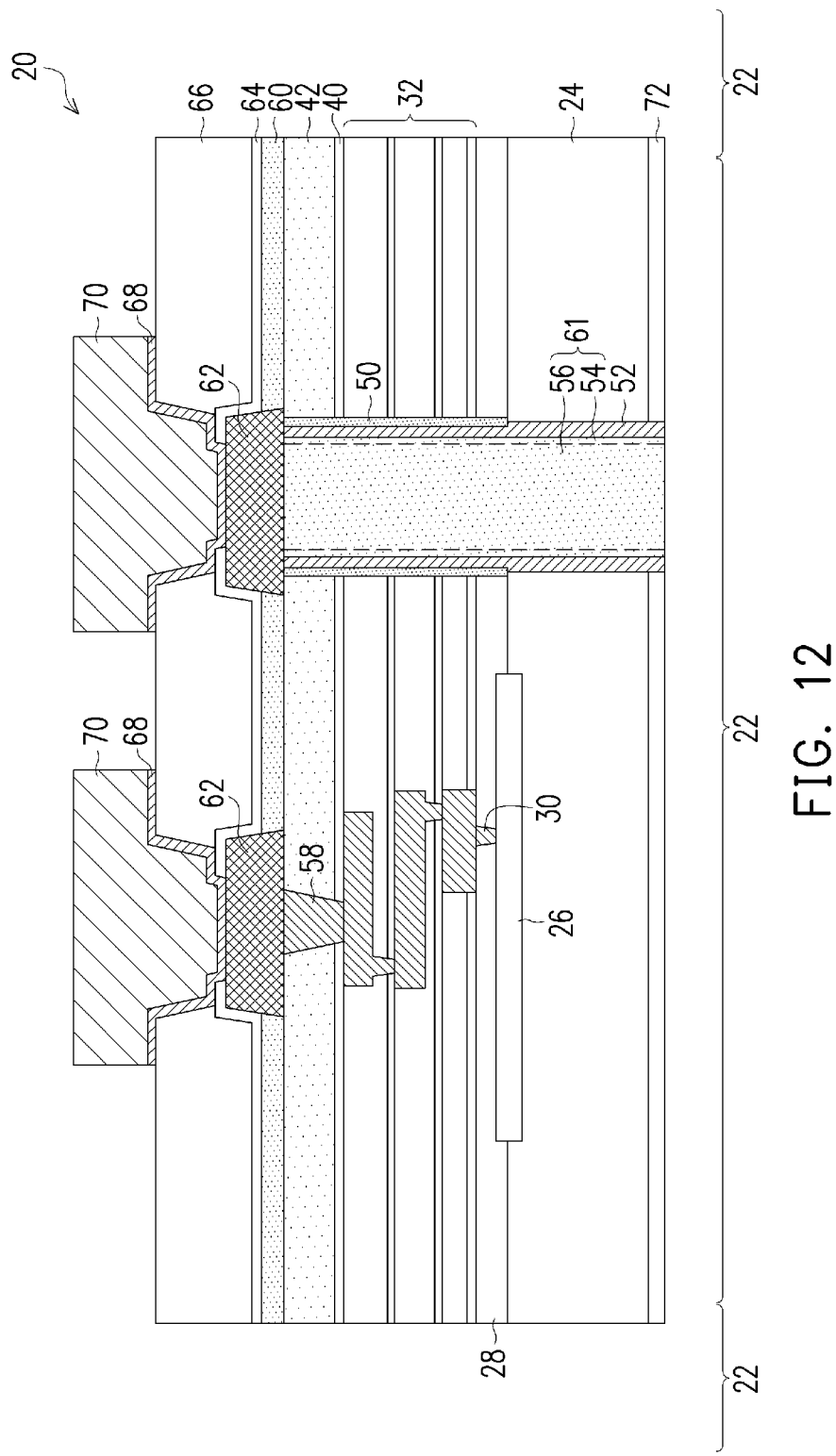
Figure 13:
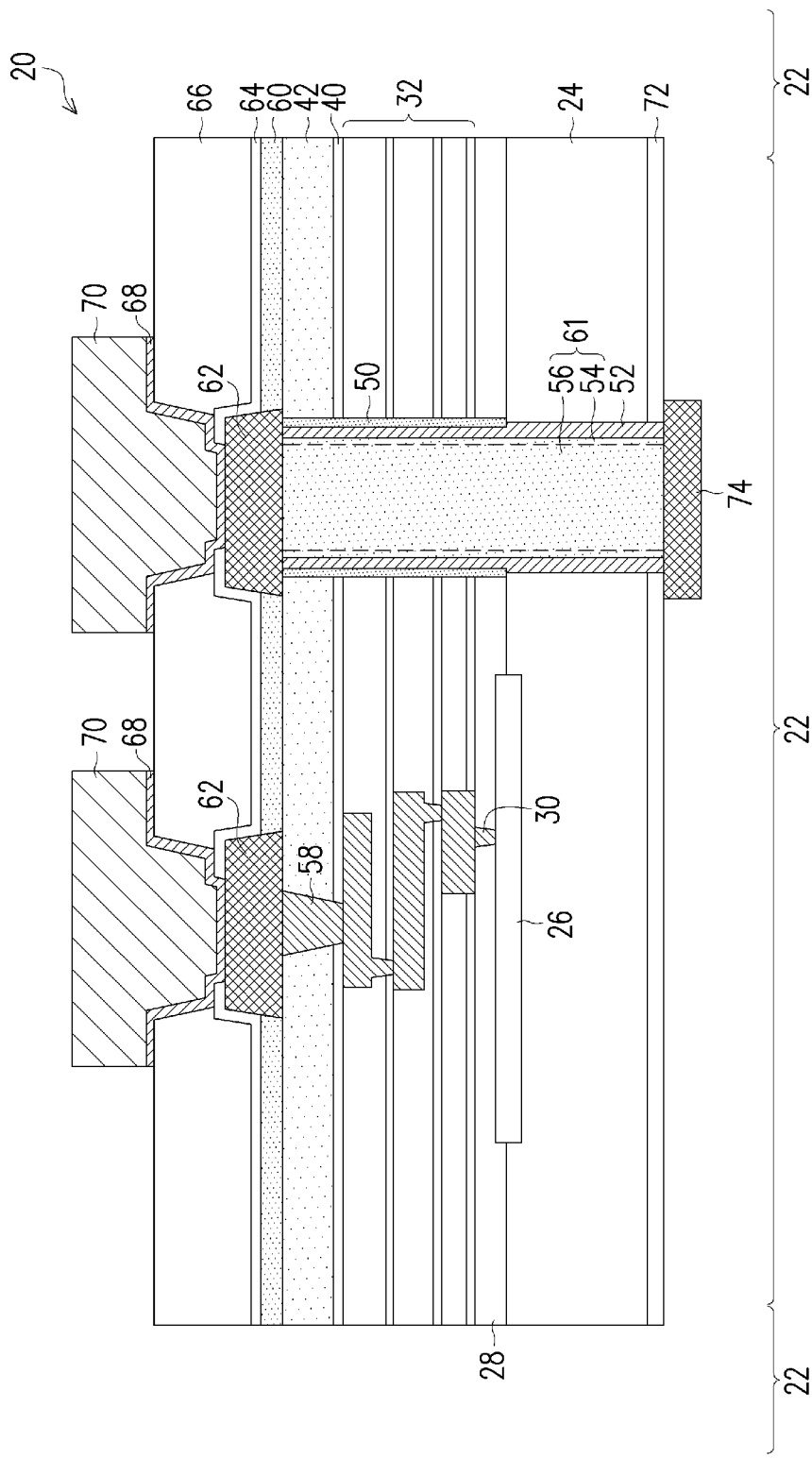

FIGS. 11 through 13 illustrate the process for forming features on the backside of semiconductor substrate 24. The respective process is illustrated as process 226 in the process flow 200 as shown in FIG. 20. Referring to FIG. 11, a backside grinding process is performed to remove a portion of substrate 24, until TSV 61 is revealed. Next, semiconductor substrate 24 is recessed slightly (for example, through etching), so that TSV 61 protrudes out of the back surface of semiconductor substrate 24, as shown in FIG. 12.

Next, as shown in FIG. 12, dielectric layer 72 is deposited, followed by a CMP process or a mechanical grinding process to re-expose TSV 61. TSV 61 thus penetrates through dielectric layer 72. In accordance with some embodiments, dielectric layer 72 is formed of silicon oxide, silicon nitride, or the like. Referring to FIG. 13, RDL 74 is formed, which includes a pad portion contacting TSV 61. RDL 74 may be formed of aluminum, copper, nickel, titanium, or the like in accordance with some embodiments.

Figure 14A:
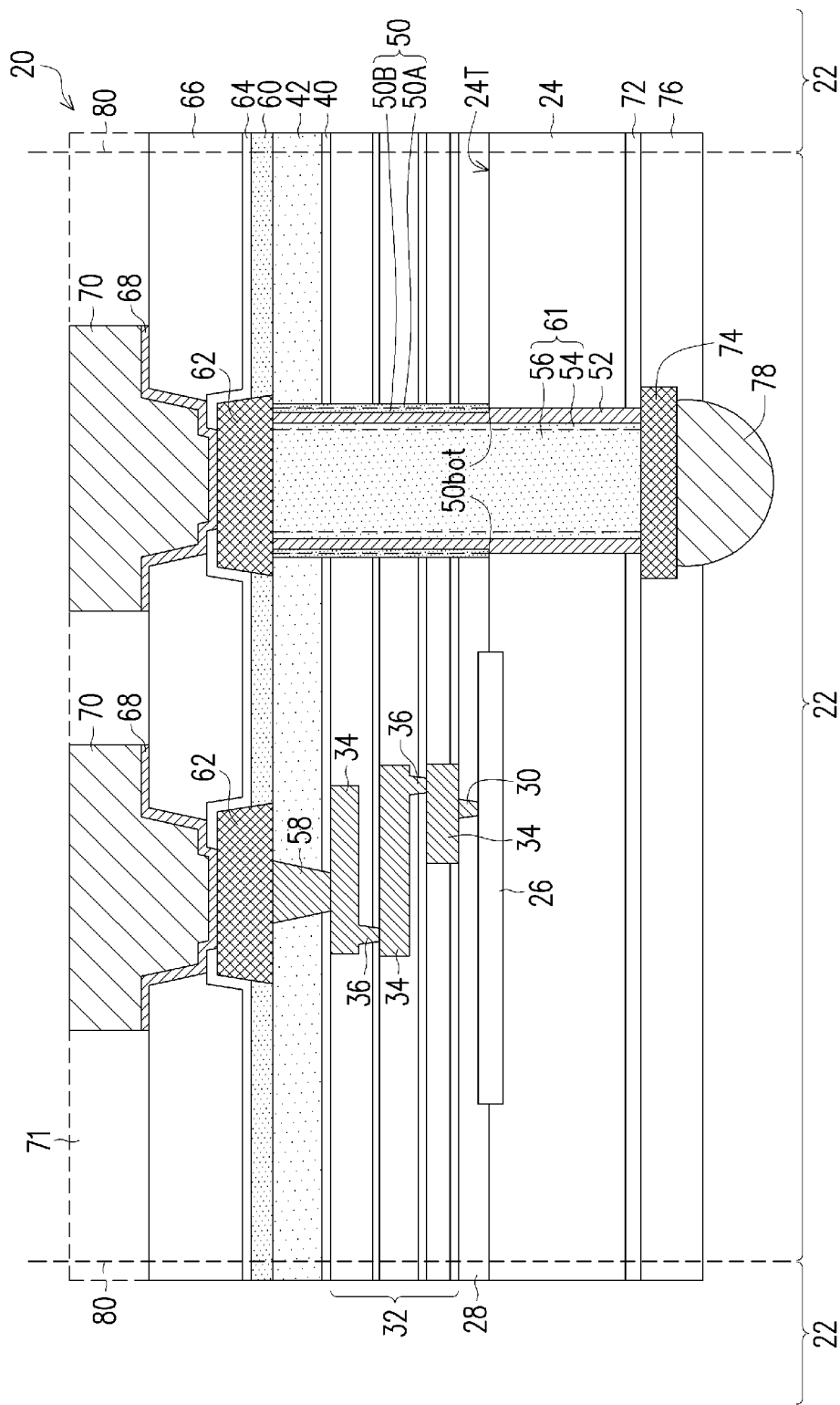

FIG. 14A illustrates the formation of dielectric layer 76 and electrical connector 78. In accordance with some embodiments, electrical connector 78 includes a solder region, which may be formed by plating a solder ball on the pad of RDL 74, and reflowing the solder ball. In accordance with alternative embodiments, electrical connector 78 is formed of non-reflowable (non-solder) metallic materials. For example, electrical connector 78 may be formed as a copper pad or pillar, and may or may not include a nickel capping layer. Electrical connector 78 may protrude out of the surrounding dielectric layer, and may be used for solder bonding or direct metal-to-metal bonding. Alternatively, the bottom surface of electrical connector 78 may be coplanar with the bottom surface of dielectric layer 76, so that device 22 may be used for hybrid bonding. Dielectric layer 71, which is on the front side of wafer 20, is also shown in FIG. 14A using dashed lines to indicate that it may or may not be formed. Although not shown in FIGS. 14B, 14C, 14D, 14E, 14F, and 14G, dielectric layer 71 may also be formed in the structures illustrated in these figures. In accordance with some embodiments, wafer 20 is singulated through a sawing process, for example, by cutting through scribe lines 80.

Figure 14B:
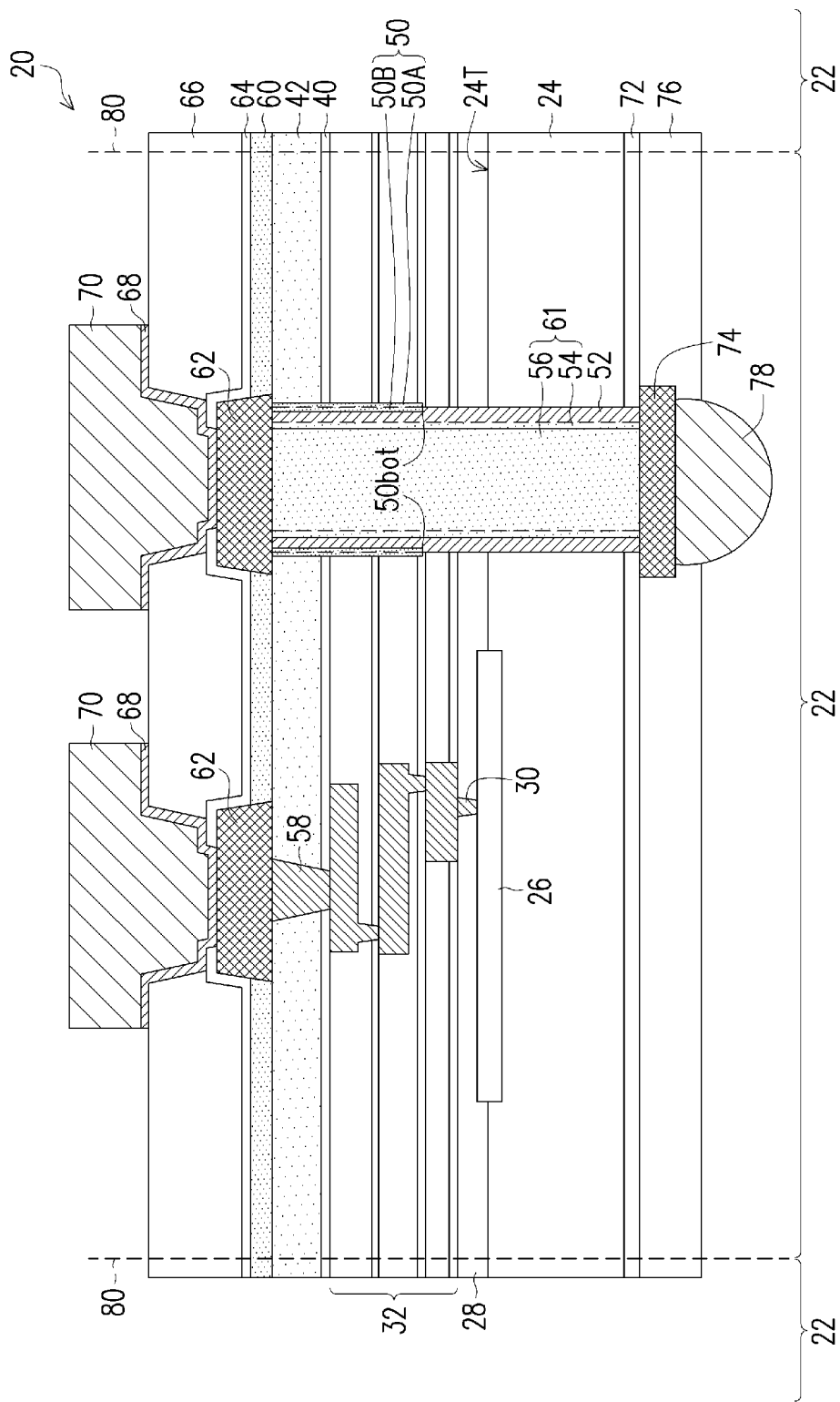
Figure 14C:
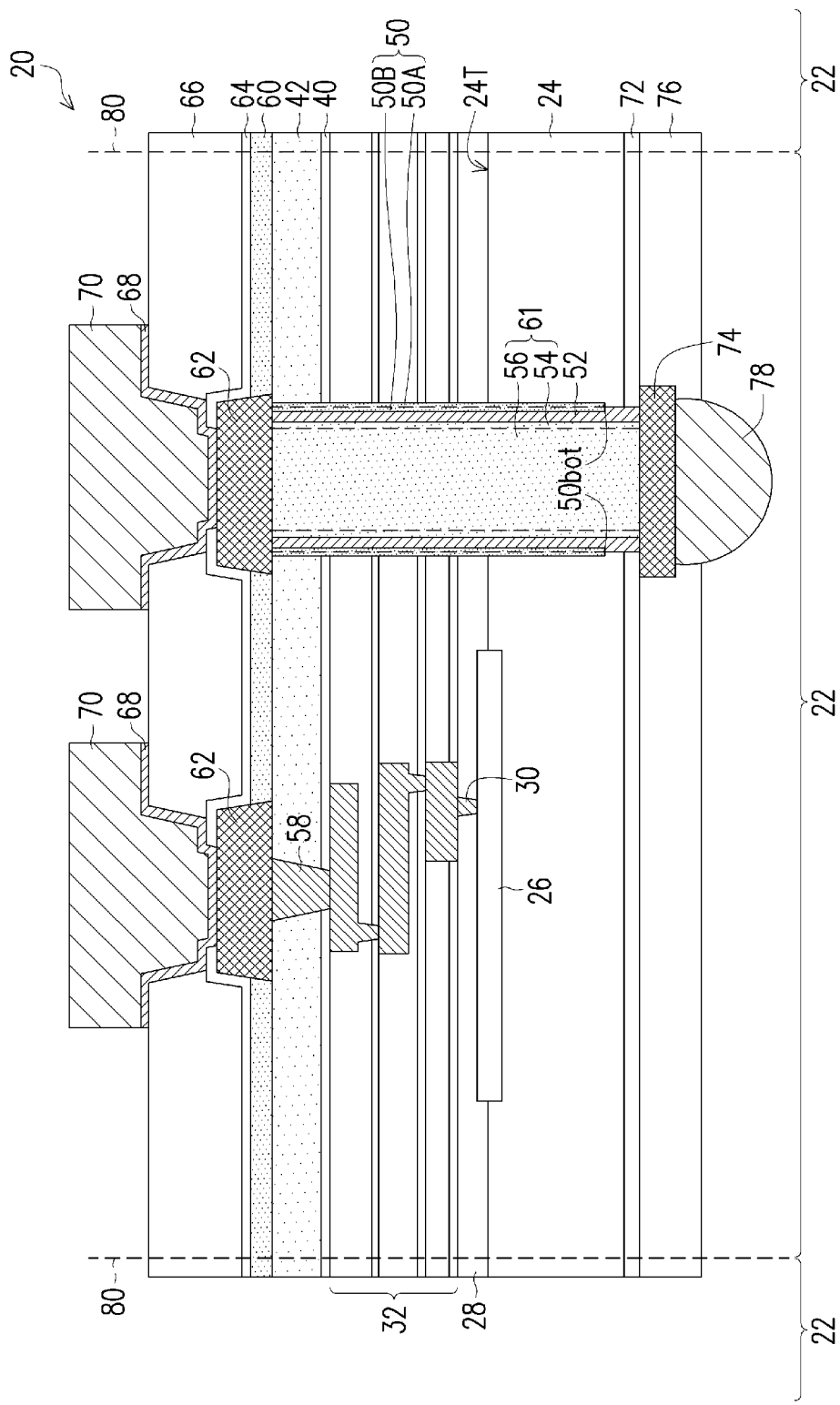
Figure 14D:
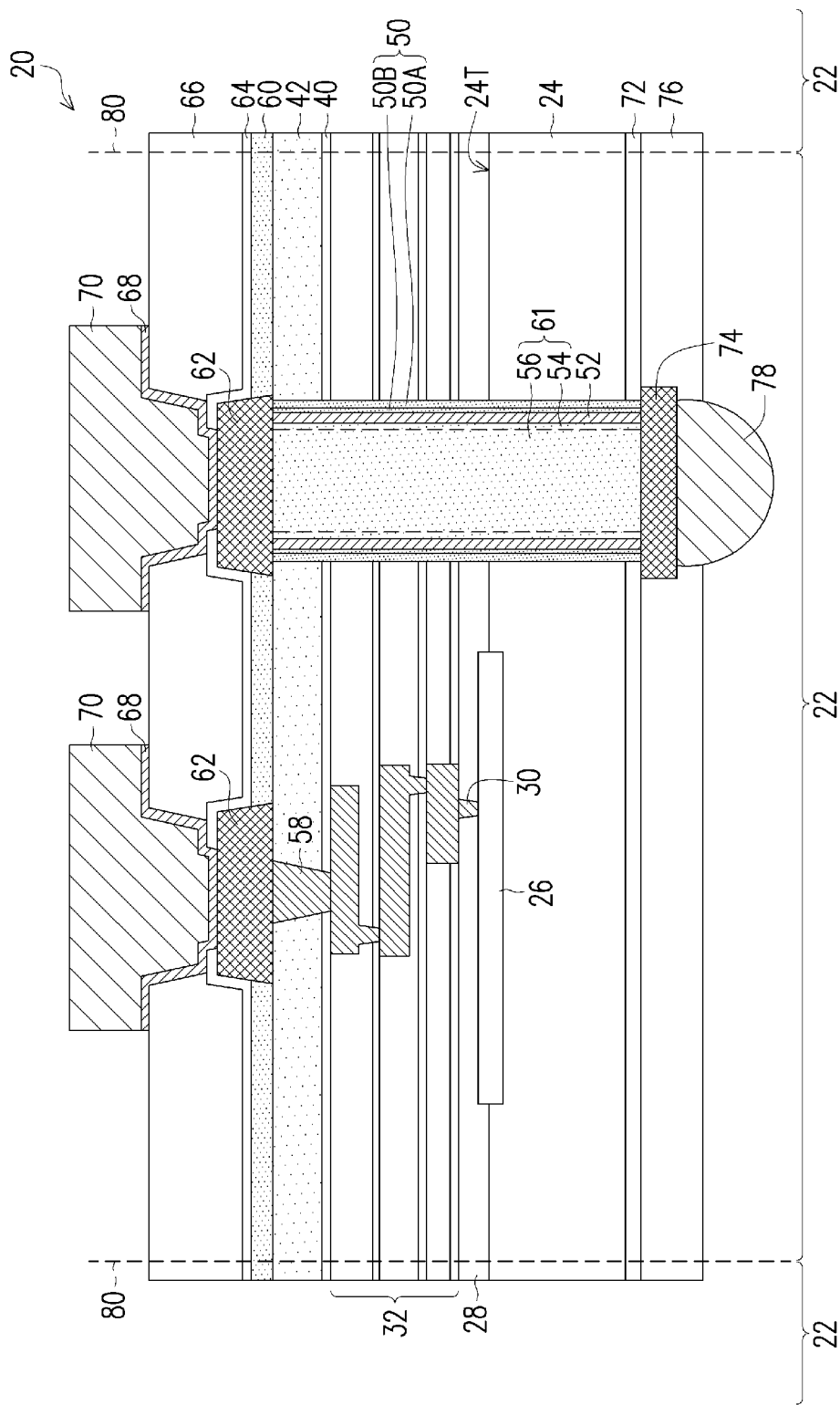
Figure 14E:
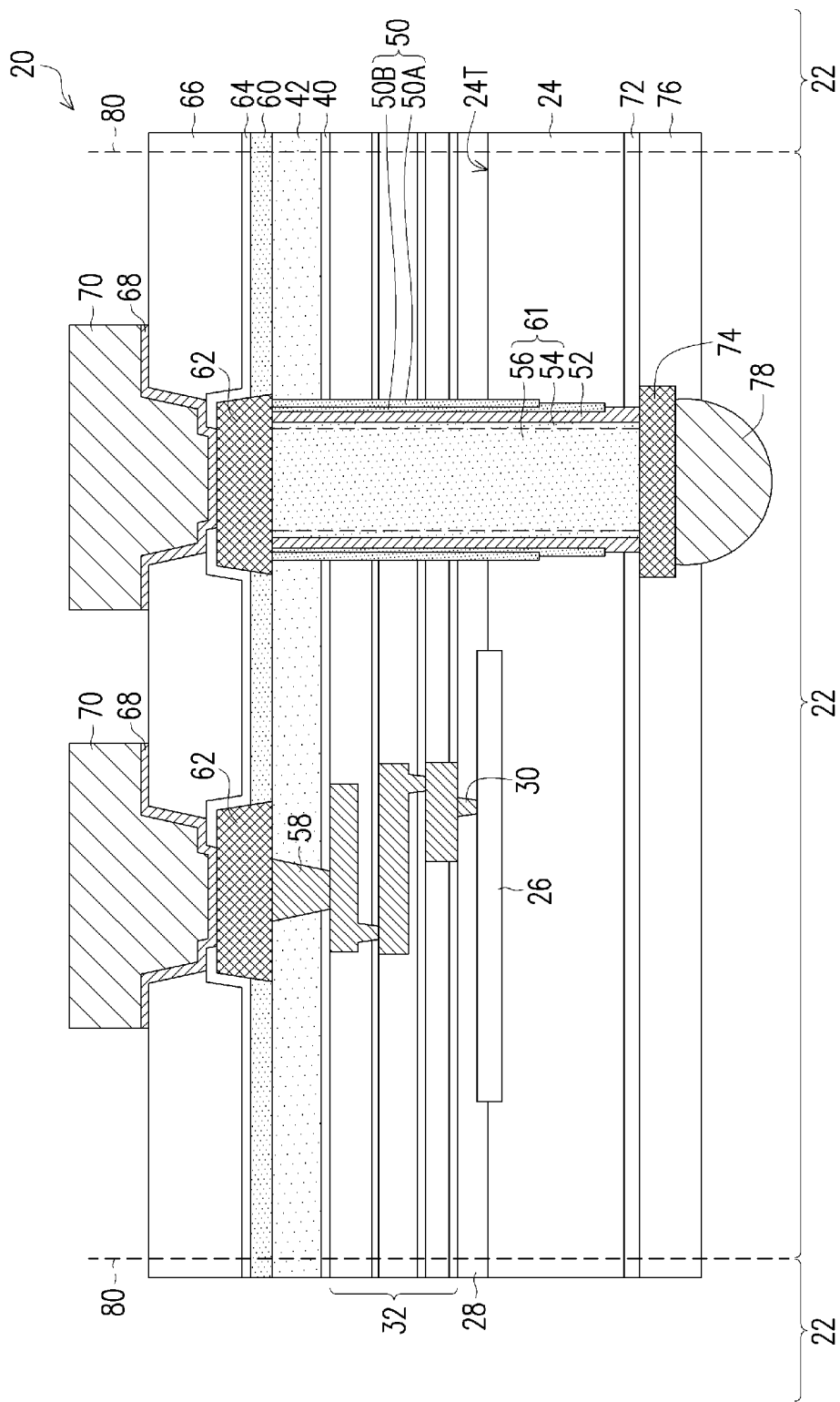
Figure 14F:
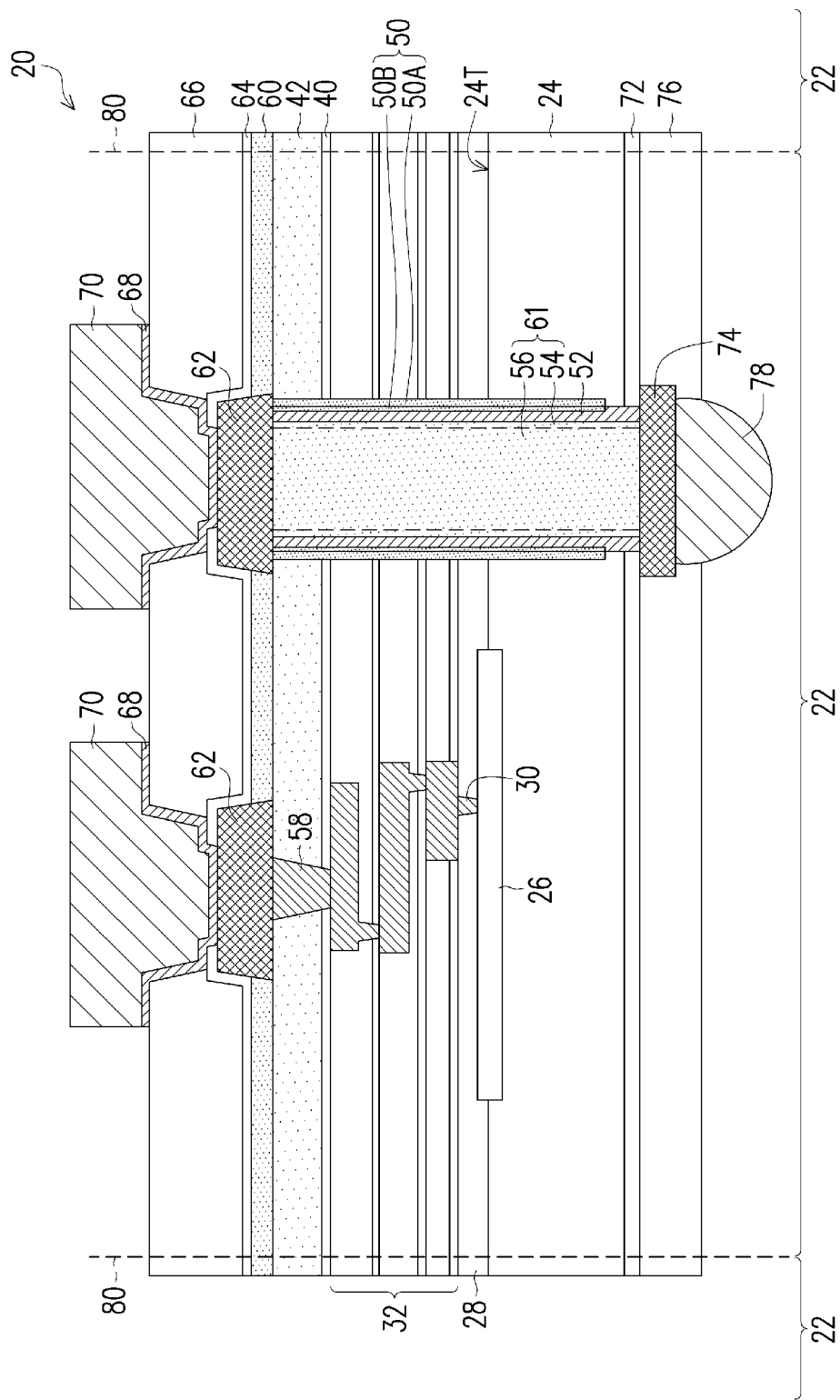
Figure 14G:
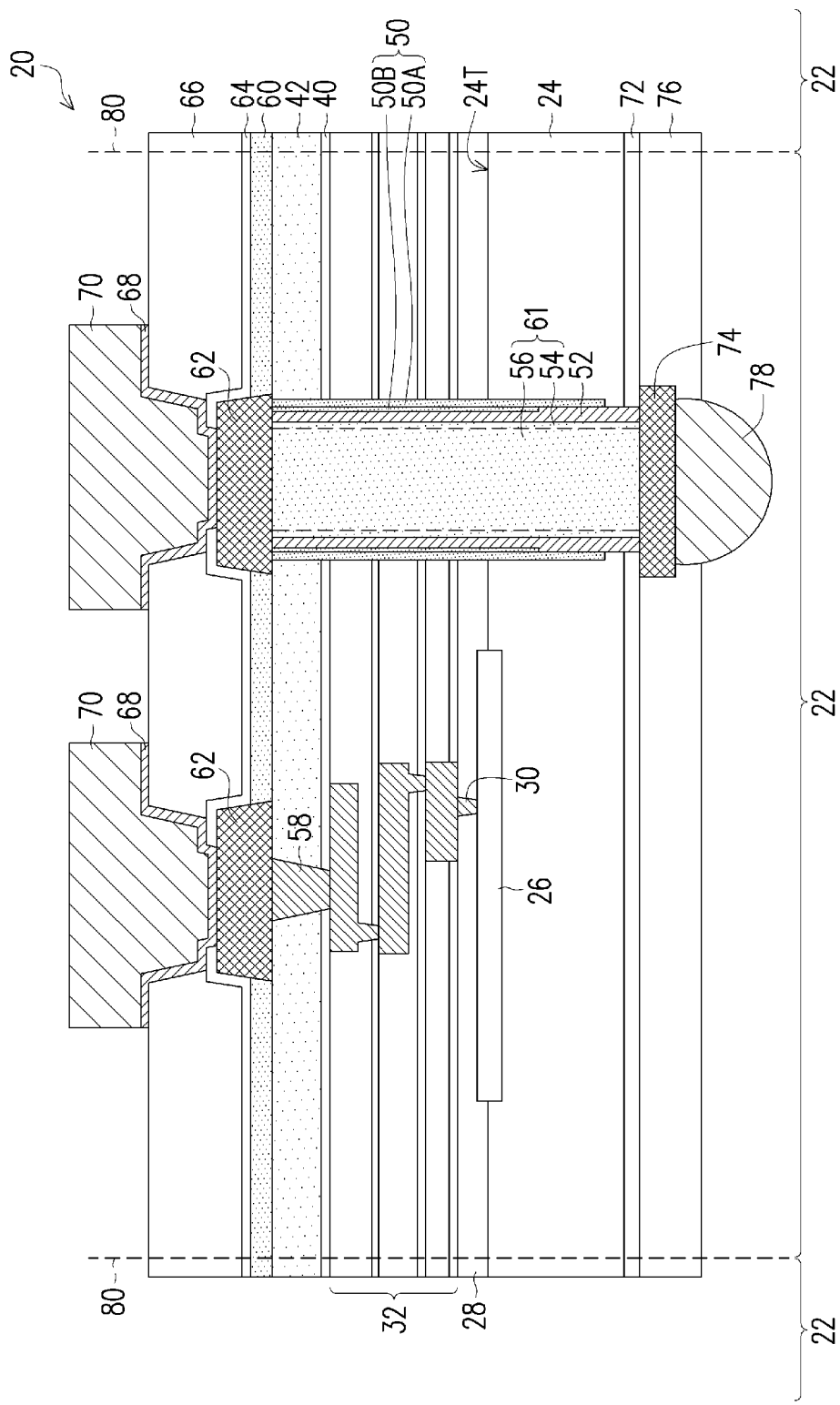

FIGS. 14B, 14C, 14D, 14E, 14F, and 14G illustrate the structures formed based on the structure shown in FIGS. 3B, 3C, 3D, 3E, 3F, and 3G, respectively. The details of the processes and materials for forming the structures shown in FIGS. 14B, 14C, 14D, 14E, 14F, and 14G may be found referring to the discussion of FIGS. 3B, 3C, 3D, 3E, 3F, and 3G, respectively, and the discussion of FIGS. 4 through 13. In each of FIGS. 14A, 14B, 14C, and 14D, dashed lines are drawn in liners 50, which indicate that liners 50 may be single-layer liners, or may be dual-layer liners including sub liners 50A and 50B. Also, the bottoms of liners 50A may be lower than, level with, or higher than the bottoms of the respective liners 50B. In FIG. 14A, liner 50 has a bottom end 50bot level with the top surface 24T of semiconductor substrate 24. When dielectric liner 50 has two sub liners 50A and 50B, one of the sub liners 50A and 50B has the bottom end 50bot level with the top surface 24T, while the bottom end 50bot of the other one may be higher than, lower than, or level with, top surface 24T of semiconductor substrate 24. FIG. 14B illustrates that the bottom end 50bot of liner 50 (or at least one of sub liners 50A and 50B) is higher than top surface 24T. FIG. 14C illustrates that the bottom end of liner 50 (or at least one of sub liners 50A and 50B) is lower than top surface 24T. FIG. 14D illustrates that the bottom end of liner 50 (and sub liners 50A and 50B) extends to the bottom surface of semiconductor substrate 24. FIG. 14E illustrates that sub liner 50A has bottom higher than the bottom of sub liner 50B. FIG. 14F illustrates that sub liner 50A extends to a same level as sub liner 50B. FIG. 14G illustrates that sub liner 50A extends lower than sub liner 50B.

In above-discussed examples, the top end of TSV 61 is level with the top surface of passivation layer 42. In accordance with alternative embodiments, the top end of TSV 61 may be at any other level (whenever applicable) lower than the top surface of passivation layer 42. For example, the top surface of TSV 61 may be coplanar with the top surface of the top metal layer in interconnect structure 32, with the top surface of any other dielectric layer in interconnect structure 32, coplanar with the top surface of ILD 28, or coplanar with the top surface of substrate 24.

Figure 15:
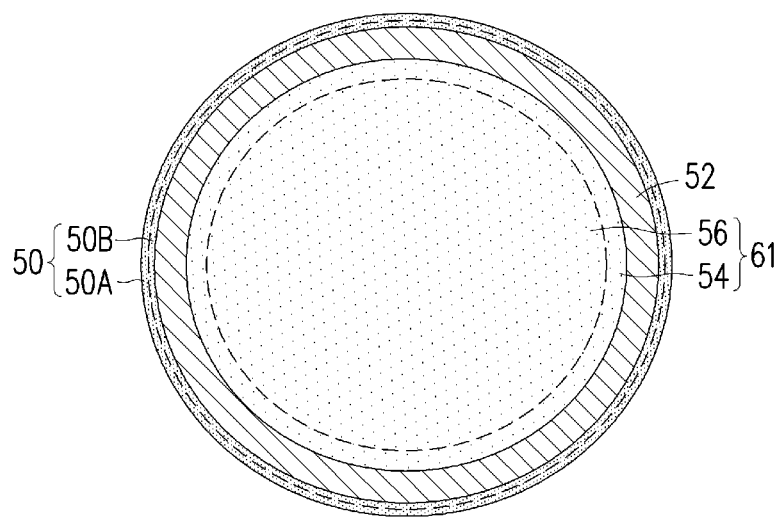
FIG. 15 illustrates a plane view of a through-via in accordance with some embodiments.

FIG. 15 illustrates a plane view of TSV 61. In accordance with some embodiments, each of liners 50A and 50B and dielectric liner 52 forms a ring, which may have a circular shape, a polygonal shape (such as a hexagonal shape or an octagonal shape), or the like. Metal seed layer 54 (if including a material different from that of conductive material 56), may be distinguishable.

FIG. 16 illustrates TSV 61 and liners 50 and 52 in accordance with some embodiments. The bottom ends of liner 50 (and sub layers 50A and 50B) may have gradually reduced thicknesses, with upper portions being thicker than the respective bottom portions. As aforementioned, due to process variations, different parts of liners 50 may extend to different levels. Also, there may be, or may not be, some portions 50' of liner 50 separated from the upper portion of liner 50 to form discrete islands.

Figure 17:
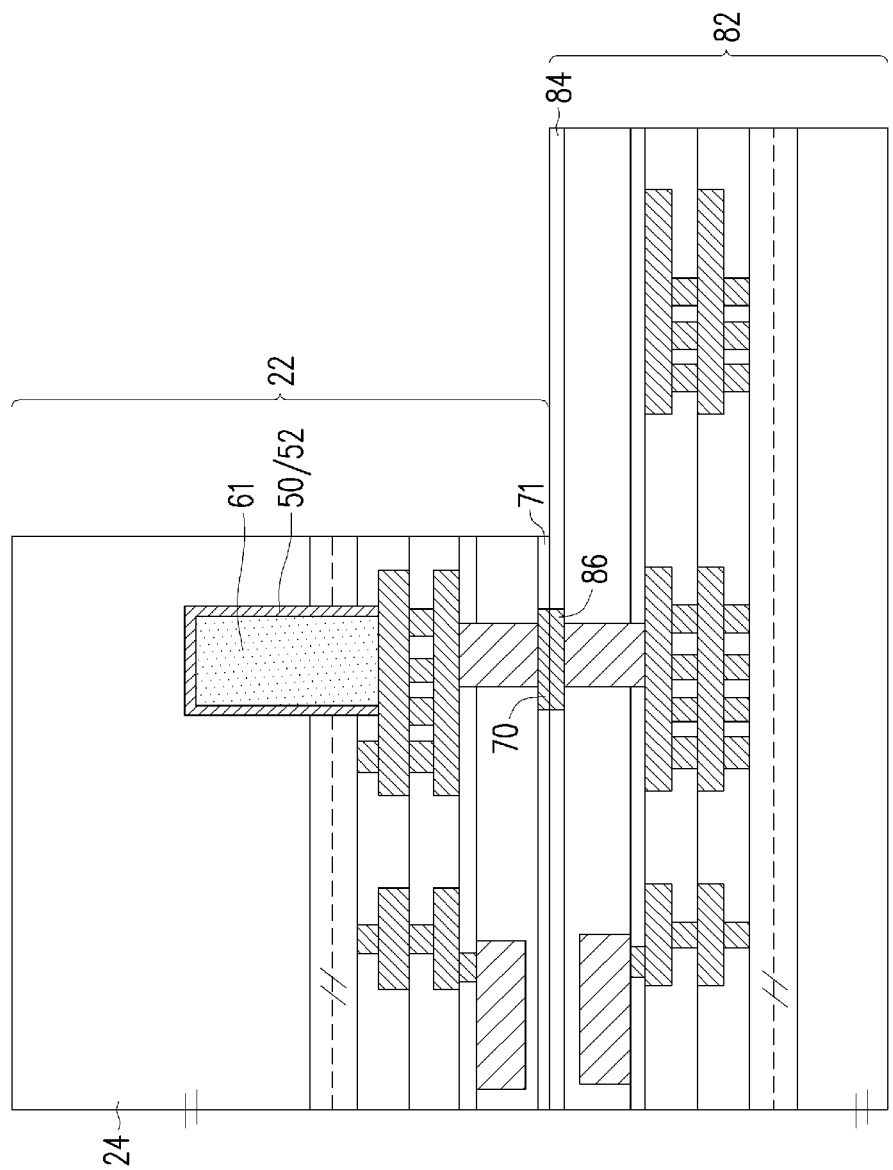
FIGS. 17 through 19 illustrate the cross-sectional views of intermediate stages in the packaging of a die including a through-via in accordance with some embodiments.
Figure 18:
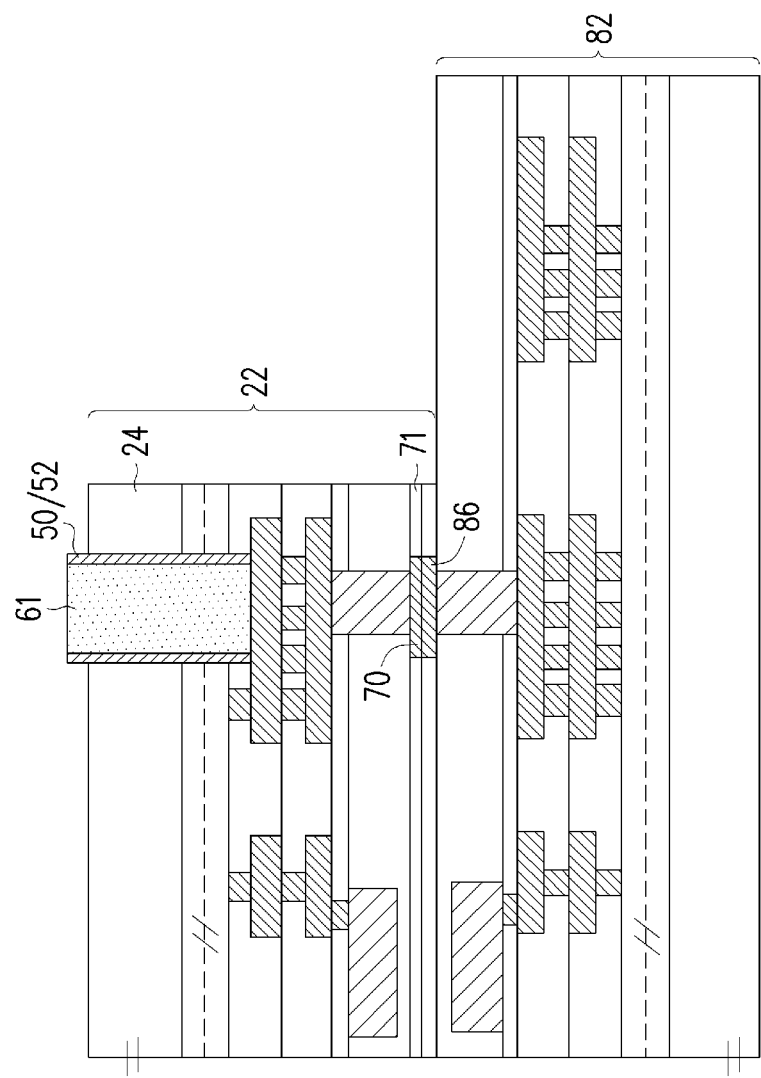
Figure 19:
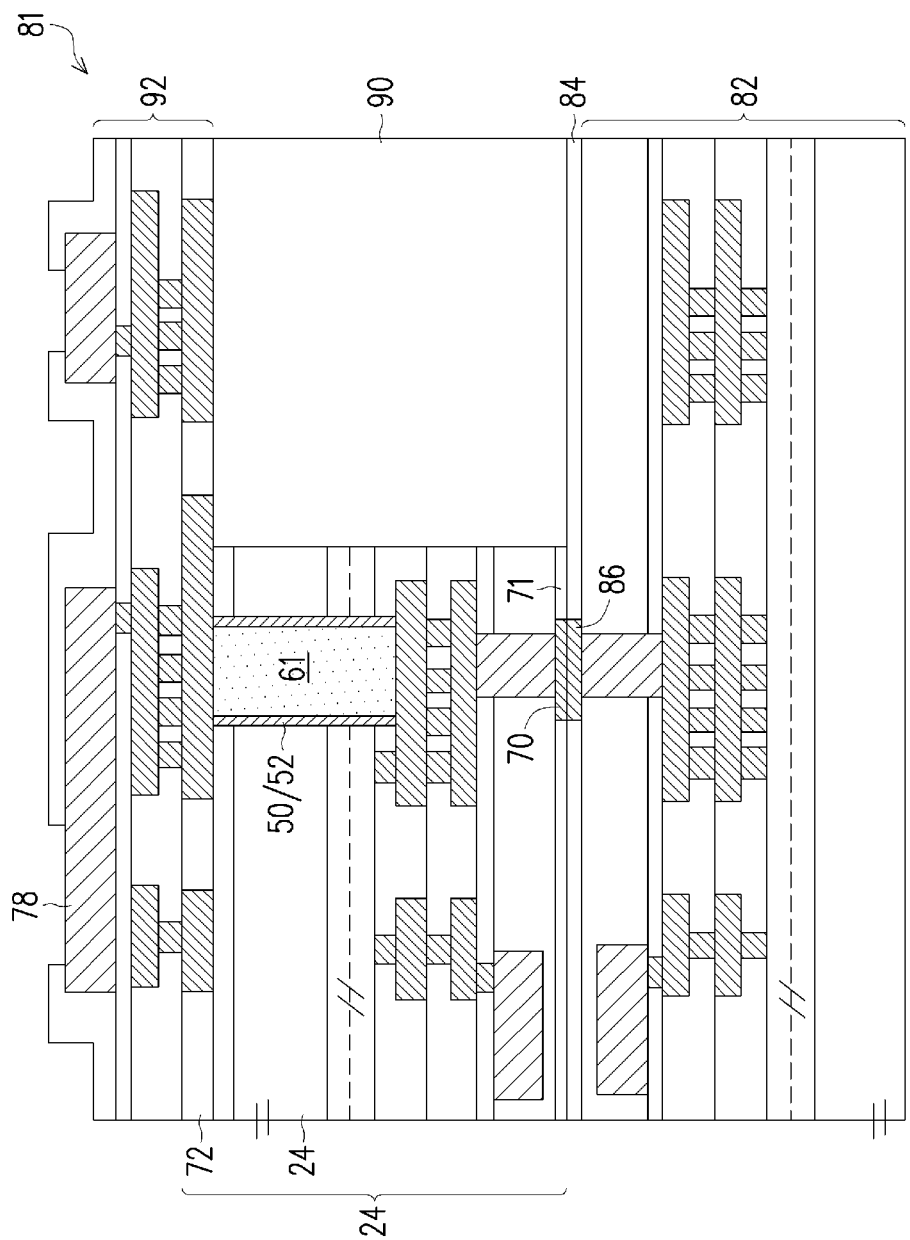

FIGS. 17 through 19 illustrate the intermediate stages in the formation of package 81 (FIG. 19), which includes device 22 therein. It is appreciated that device 22 is illustrated schematically, and the details (such as the liners of TSVs) of device 22 may be found referring to the above-recited disclosure. Referring to FIG. 17, device 22 is bonded to device 82. The bonding may be performed through hybrid bonding, with dielectric layer 71 and electrical connector (conductive region) 70 bonded to the surface dielectric layer 84 and bond pad 86, respectively, of device 82. Device 82 may be a device die, a package substrate, an interposer, a package, or the like.

FIG. 18 illustrates the structure after the backside grinding process is performed on semiconductor substrate 24, and after the recessing of semiconductor substrate 24 through etching. Accordingly, TSV 61 protrudes higher than the back surface of semiconductor substrate 24. Next, as shown in FIG. 19, dielectric layer 72 is deposited, followed by a planarization process to level the top surfaces of dielectric layer 72 and TSV 61. Gap filling region 90 is then formed, which may be formed of or comprise a molding compound, silicon nitride, silicon oxide, or the like, or combinations thereof. Interconnect structure 92, which includes electrical connector 78, is then formed over device 22 and gap filling region 90. Interconnect structure 92 is electrically connected to device 82 through TSV 61.

The embodiments of the present disclosure have some advantageous features. By forming more than one dielectric liner for through-vias, the electrical performance of the respective device is more stable. The liner(s) may be selectively formed on the sidewall of some parts (such as the parts not in the semiconductor substrate) of the TSVs, so that parasitic capacitance may be reduced.

In accordance with some embodiments of the present disclosure, a method comprises forming a plurality of dielectric layers over a semiconductor substrate; etching the plurality of dielectric layers and the semiconductor substrate to form an opening; depositing a first liner extending into the opening; depositing a second liner over the first liner, wherein the second liner extends into the opening; filling a conductive material into the opening to form a through-via; and forming conductive features on opposing sides of the semiconductor substrate, wherein the conductive features are electrically interconnected through the through-via. In an embodiment, the depositing the first liner is performed using a non-conformal deposition method. In an embodiment, the depositing the second liner is performed using a conformal deposition method. In an embodiment, the first liner is deposited to have a first bottom higher than a second bottom of the opening. In an embodiment, the first bottom is level with a top surface of the semiconductor substrate. In an embodiment, the first bottom is higher than a top surface of the semiconductor substrate. In an embodiment, the first bottom is lower than a top surface of the semiconductor substrate. In an embodiment, the depositing the first liner comprises depositing a conductive liner, and the depositing the second liner comprises depositing a dielectric liner. In an embodiment, the depositing the first liner comprises depositing silicon nitride, and the depositing the second liner comprises depositing silicon oxide. In an embodiment, the depositing the first liner comprises depositing silicon carbide, and the depositing the second liner comprises depositing silicon oxide.

In accordance with some embodiments of the present disclosure, a structure comprises a semiconductor substrate; a plurality of dielectric layers over the semiconductor substrate; a first conductive feature over the plurality of dielectric layers; a second conductive feature underlying the semiconductor substrate; a through-via penetrating through the semiconductor substrate and the plurality of dielectric layers, wherein the through-via electrically interconnects the first conductive feature and the second conductive feature; a first liner encircling the through-via; and a second liner encircling the first liner, wherein the second liner has a higher density than the first liner. In an embodiment, the first liner is in physical contact with a top portion of the through-via, and the second liner is in physical contact with a bottom portion of the through-via. In an embodiment, a bottom end of the second liner is level with a top surface of the semiconductor substrate. In an embodiment, a bottom end of the second liner is higher than a top surface of the semiconductor substrate. In an embodiment, a bottom end of the second liner is lower than a top surface of the semiconductor substrate. In an embodiment, the first liner comprises silicon oxide, and the second liner comprises silicon nitride. In an embodiment, the second liner comprises a first sub layer and a second sub layer encircling the first sub layer, and wherein bottom ends of the first sub layer and the second sub layer are at different levels.

In accordance with some embodiments of the present disclosure, a structure comprises a die. The die comprises a semiconductor substrate; a plurality of low-k dielectric layers over the semiconductor substrate; a through-via penetrating through the semiconductor substrate and the plurality of low-k dielectric layers; a first liner encircling the through-via, wherein the first liner extends to both a top end and a bottom end of the through-via; a second liner encircling the first liner, wherein the second liner is shorter than the through-via; a first electrical connector over the semiconductor substrate and at a top surface of the die; and a second electrical connector underlying the semiconductor substrate and at a bottom surface of the die, wherein the first electrical connector and the second electrical connector are electrically interconnected through the through-via. In an embodiment, the second liner is denser than the first liner. In an embodiment, the second liner is thinner than the first liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a semiconductor substrate;
   a plurality of dielectric layers over the semiconductor substrate;
   a first conductive feature over the plurality of dielectric layers;
   a second conductive feature underlying the semiconductor substrate;
   a through-via penetrating through the semiconductor substrate and the plurality of dielectric layers, wherein the through-via electrically interconnects the first conductive feature and the second conductive feature;
   a first liner encircling the through-via; and
   a second liner encircling the first liner, wherein the second liner has a higher density than the first liner.

2. The structure of claim 1, wherein the first liner is in physical contact with a top portion of the through-via, and the second liner is in physical contact with a bottom portion of the through-via.

3. The structure of claim 2, wherein a bottom end of the second liner is level with a top surface of the semiconductor substrate.

4. The structure of claim 2, wherein a bottom end of the second liner is higher than a top surface of the semiconductor substrate.

5. The structure of claim 2, wherein a bottom end of the second liner is lower than a top surface of the semiconductor substrate.

6. The structure of claim 1, wherein the first liner comprises silicon oxide, and the second liner comprises silicon nitride.

7. The structure of claim 1, wherein the second liner comprises a first sub layer and a second sub layer encircling the first sub layer, and wherein bottom ends of the first sub layer and the second sub layer are at different levels.

8. A structure comprising:
  a die comprising:
    a semiconductor substrate;
    a plurality of low-k dielectric layers over the semiconductor substrate;
    a through-via penetrating through the semiconductor substrate and the plurality of low-k dielectric layers;
    a first liner encircling the through-via, wherein the first liner extends to both of a top end and a bottom end of the through-via;
    a second liner encircling the first liner, wherein the second liner is shorter than the through-via;
    a first electrical connector over the semiconductor substrate and at a top surface of the die; and
    a second electrical connector underlying the semiconductor substrate and at a bottom surface of the die, wherein the first electrical connector and the second electrical connector are electrically interconnected through the through-via.

9. The structure of claim 8, wherein the second liner is denser than the first liner.

10. The structure of claim 8, wherein the second liner is thinner than the first liner.

11. The structure of claim 8, wherein the second liner extends to the top end of the through-via, and is spaced apart from the bottom end of the through-via.

12. The structure of claim 8, wherein the second electrical connector is spaced apart from the semiconductor substrate.

13. The structure of claim 8, wherein the second liner further comprises a first sub layer and a second sub layer formed of different dielectric materials.

14. The structure of claim 13, wherein the first sub layer and the second sub layer comprise same elements with different atomic percentages of the same elements.

15. The structure of claim 13, wherein bottoms of the first sub layer and the second sub layer are at different levels.

16. A structure comprising:
  a semiconductor substrate;
  a plurality of dielectric layers over the semiconductor substrate;
  a through-via penetrate through the semiconductor substrate and the plurality of dielectric layers;
  a top conductive feature overlying and contacting the through-via;
  a bottom conductive feature underlying and contacting the through-via;
  a first liner encircling and contacting the through-via, wherein the first liner extends from a bottom surface of the top conductive feature to the bottom conductive feature; and
  a second liner encircling and contacting the first liner, wherein the second liner extends from the bottom surface of the top conductive feature to an intermediate level between the top conductive feature and the bottom conductive feature.

17. The structure of claim 16, wherein the first liner is a conformal layer.

18. The structure of claim 17, wherein the second liner is a non-conformal layer.

19. The structure of claim 17, wherein a bottom of the second liner is higher than a top surface of the semiconductor substrate.

20. The structure of claim 17, wherein a bottom of the second liner is substantially level with a top surface of the semiconductor substrate.

* * * * *